(12) United States Patent
Kim et al.

(10) Patent No.: US 8,319,538 B2
(45) Date of Patent: Nov. 27, 2012

(54) SEMICONDUCTOR DEVICE

(75) Inventors: Yong-Hoon Kim, Gyeonggi-do (KR); Hyun-Woo Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 183 days.

(21) Appl. No.: 12/754,313

(22) Filed: Apr. 5, 2010

(65) Prior Publication Data

US 2011/0187432 A1    Aug. 4, 2011

(30) Foreign Application Priority Data

Jan. 29, 2010   (KR) .................. 10-2010-0008721

(51) Int. Cl.
*H03H 11/26* (2006.01)
(52) U.S. Cl. ...................................... 327/263
(58) Field of Classification Search .................. None
See application file for complete search history.

(56) References Cited

U.S. PATENT DOCUMENTS 7,961,017 B2 * 6/2011 Lee ........................ 327/158
2009/0146709 A1 * 6/2009 Lee et al. ................. 327/158

FOREIGN PATENT DOCUMENTS

KR    1020070096748    10/2007

OTHER PUBLICATIONS

Notice of Preliminary Rejection issued from Korean Intellectual Property Office on Jun. 10, 2011.

* cited by examiner

*Primary Examiner* — Lincoln Donovan
*Assistant Examiner* — Sibin Chen
(74) *Attorney, Agent, or Firm* — IP & T Group LLP

(57) ABSTRACT

A semiconductor device including a common delay circuit configured to delay an input signal in response to a delay control code to output a first delayed input signal and a second delayed input signal; a first delay circuit configured to delay the first delayed input signal in response to the delay control code and to output a first output signal; and a second delay circuit configured to delay the second delayed input signal in response to the delay control code and to output a second output signal.

13 Claims, 6 Drawing Sheets

US 8,319,538 B2

SEMICONDUCTOR DEVICE

CROSS-REFERENCE TO RELATED APPLICATION

The present application claims priority of Korean Patent Application No. 10-2010-0008721, filed on Jan. 29, 2010, which is incorporated herein by reference in its entirety.

BACKGROUND OF THE INVENTION

Exemplary embodiments of the present invention relate to a semiconductor device, and more particularly, to a semiconductor device with a delay line for delaying and outputting an input signal.

A synchronous semiconductor memory device such as Double Data Rate Synchronous Dynamic Random Access Memory transfers and receives data to and from an external device, such as a memory controller CTRL, by using an internal clock synchronized with an external clock inputted from the external device.

To stably transfer a data between a memory device and a memory controller, it is important to temporally synchronize the data outputted from the memory device with an external clock transferred from the memory controller to the memory device.

A data is outputted from the memory device in synchronization with an internal clock. The internal clock is transferred to the memory device in synchronization with the external clock in the initial block but the internal clock becomes delayed as it goes through the constituent elements inside the memory device (internal delay time) and thus by the time when the internal clock is outputted out of the memory device, it may not be synchronized with the external clock any more.

Therefore, to stably transfer a data outputted from the memory device, the internal clock should be compensated for the internal delay time when the data is loaded on a bus so that the internal clock is synchronized with the external clock transferred from the memory controller and thus accurately positioned at the edge or center of the external clock.

As mentioned above, the internal clock should be compensated for the internal delay time when the data is loaded on a bus. Herein, the internal clock is a delayed clock obtained as the external clock transferred from the memory controller passes through a delay circuit modeled based on the constituent elements inside the memory device that transfers the data. Since the delay amount of the delay circuit modeled based on the constituent elements inside the memory device that transfers the data cannot be altered, a method of further delaying the phase of the internal clock until the phase of the internal clock is synchronized with the phase of the external clock has been conventionally used.

However, it is difficult to calculate the phase difference between the internal clock and the external clock in advance. Moreover, the phase difference between the internal clock and the external clock may be changed at any time according to the driving environment of the memory device. Therefore, the internal clock is delayed in a delay circuit whose delay amount is freely changed according to a control signal in order to accurately synchronize the phase of the internal clock with the phase of the external clock.

Also, when the driving environment of the memory device is worst, the phase difference between the internal clock and the external clock may reach almost one clock cycle (that is, 1tck). To accurately synchronize the phase of the internal clock with the phase of the external clock while satisfying condition of the worst driving environment, the internal clock is often delayed with a delay circuit having a wide variation of a delay amount which varies according to a control signal.

Therefore, the following delay line that satisfies the above-described conditions of the above-described delay circuit is used to synchronize the phase of the internal with the phase of the external clock.

FIG. 1 is a block diagram illustrating a conventional semiconductor device having delay lines.

Referring to FIG. 1, the conventional semiconductor device having delay lines includes an upper delay line 10 for delaying an input signal IN_SIG, a lower delay line 12 for delaying the input signal IN_SIG, and a delay controller 14 for controlling the delay amounts of the upper delay line 10 and the lower delay line 12. The conventional semiconductor device having delay lines further includes a phase mixer 16 for mixing the phase of a first output signal OUT_SIG1 outputted from the upper delay line 10 and the phase of a second output signal OUT_SIG2 outputted from the lower delay line 12 to thereby generate a final output signal OUT_SIG_F.

In examining the structures of the upper delay line 10 and the lower delay line 12, a plurality of NAND gates are serially coupled and among the plurality of the serially coupled NAND gates, NAND gates of a predetermined interval are designed to receive an input signal IN_SIG. However, to which NAND gate the input signal IN_SIG is to be transferred is determined based on a delay control code CON_1<1>, CON_1<2>, . . . , CON_1<N>, CON_2<1>, CON_2<2>, . . . , CON_2<N>, which is outputted from the delay controller 14.

The operation of the conventional semiconductor device having the above structure will be described herein.

First, referring to FIG. 1, the upper delay line 10 and the lower delay line 12 are designed to have a NAND gate at one of four positions c within the delay line as a NAND gate capable of receiving an applied input signal IN_SIG, among the plurality of NAND gates serially coupled. This is because it is assumed that the delay amount corresponding to two NAND gates is a unit delay amount in FIG. 1.

In other words, the process of generating the final output signal OUT_SIG_F by delaying the input signal IN_SIG includes a process of mixing the phase of the first output signal OUT_SIG1 outputted from the upper delay line 10 and the phase of the second output signal OUT_SIG2 outputted from the lower delay line 12 in the phase mixer 16 to thereby generate and output the final output signal OUT_SIG_F. Therefore, it can be understood that the first output signal OUT_SIG1 outputted from the upper delay line 10 and the second output signal OUT_SIG2 outputted from the lower delay line 12 may be different by the two unit delay amounts (2×unit delay amounts), which corresponds to delays through the four NAND gates, where the delay amount of the final output signal OUT_SIG_F changes by the unit delay amount corresponding to two NAND gates.

This is based on an assumption that the phase mixer 16 mixes the first output signal OUT_SIG1 outputted from the upper delay line 10 and the second output signal OUT_SIG2 outputted from the lower delay line 12 using the same weight. While an operation of changing the delay amount of the final output signal OUT_SIG_F by a delay amount smaller than the unit delay by changing the weight of the phase mixer 16 is performed after the operations of the upper delay line 10 and the lower delay line 12 can be performed, normally, the phase mixer 16 mixes the first output signal OUT_SIG1 outputted from the upper delay line 10 and the second output signal OUT_SIG2 outputted from the lower delay line 12 using the same weight during a process that the delay amounts of the first output signal OUT_SIG1 outputted from the upper delay line 10 and the second output signal OUT_SIG2 outputted from the lower delay line 12 are changed.

In the conventional semiconductor device having delay lines described above, an input signal IN_SIG is transferred to both of the upper delay line 10 and the lower delay line 12 and the phases of the two output signals OUT_SIG1 and OUT_SIG2 outputted from the upper delay line 10 and the lower delay line 12, respectively, are mixed to thereby generate the final output signal OUT_SIG_F. In this way, the delay amount of the final output signal OUT_SIG_F can be changed not only on the basis of the unit delay but also on the basis of a delay amount smaller than the unit delay amount.

To perform this operation, the conventional semiconductor device requires two delay lines, which are the upper delay line 10 and the lower delay line 12 and the input signal IN_SIG should be provided to both of the upper delay line 10 and the lower delay line 12.

In short, the two delay lines 10 and 12 should be driven simultaneously with respect to one input signal IN_SIG. Therefore, there arises a concern that an input driver 18 for driving the two delay lines 10 and 12 for one input signal IN_SIG are large in size.

Also, in examining the structures of the two delay lines 10 and 12 shown in FIG. 1, the two delay lines 10 and 12 operate in a Multiple Input Single Output (MISO) method.

To be specific, the two delay lines 10 and 12 have a structure in which multiple NAND gates corresponding to two unit delay amounts (2×unit delay amounts) selectively receives an input signal IN_SIG and the received input signal IN_SIG is outputted through a NAND gate positioned at the beginning of the two unit delay structures.

Therefore, as the two delay lines 10 and 12 becomes longer and lower, the size of the input driver 18 is increased in order to stably transfer the input signal IN_SIG to multiple NAND gates corresponding to two unit delay amounts (2×unit delay amounts). The increasing size of the input driver 18 raises a concern.

Herein, since the input driver 18 is a circuit which is always turned on while the two delay lines 10 and 12 perform an operation for delaying the input signal IN_SIG, the larger the input driver 18 is, the higher the current consumption becomes.

Also, the increase in the length of the two delay lines 10 and 12 signifies that the length of a line that the input signal IN_SIG passes through becomes long. This means that the loading applied to the input signal IN_SIG is increased, which raises a concern as well.

Moreover, the line through which the two delay lines 10 and 12 pass has a form that it is coupled in parallel to the multiple NAND gates corresponding to the two unit delay amounts (2×unit delay amounts). Therefore, there arises a concern that the gate capacitances of the transistors included in the multiple NAND gates are taken as loads.

As a result, the increase in the length of the two delay lines 10 and 12 leads to an increase in the size of the loads applied to the input signal IN_SIG. The increased load not only inhibits the input signal IN_SIG from being transferred quickly but also adversely affects the signal quality of the input signal IN_SIG.

According to the conventional technology, the increased load not only renders the delay lines unsuitable for a fast response time but also impairs the accuracy. Therefore, the conventional method is not applicable to a semiconductor device with delay lines operating at a high speed.

SUMMARY OF THE INVENTION

An embodiment of the present invention is directed to a semiconductor device having delay lines which can delay an input signal with a wide variation width while maintaining the loading applied to a signal input node and the amount of operation current to minimum levels.

In accordance with an embodiment of the present invention, a semiconductor device includes: a common delay circuit configured to delay an input signal in response to a delay control code to output a first delayed input signal and a second delayed input signal; a first delay circuit configured to delay the first delayed input signal in response to the delay control code and to output a first output signal; and a second delay circuit configured to delay the second delayed input signal in response to the delay control code and to output a second output signal.

In accordance with another embodiment of the present invention, a semiconductor device includes: an input delay circuit configured to generate a first delay signal by delaying an input signal through a common delay path whose length is determined in response to a delay control code, and generate a second delay signal by delaying the first delay signal through an additional delay path whose length is determined in response to the delay control code; a first output delay circuit configured to delay the first delay signal through a first delay path whose length is determined in response to the delay control code and output a delayed first delay signal; and a second output delay circuit configured to delay either the first delay signal or the second delay signal through a second delay path whose length is determined in response to the delay control code and output a delayed first delay signal or a delayed second delay signal.

In accordance with yet another embodiment of the present invention, a semiconductor device having delay lines formed of a plurality of series-coupled unit delay blocks includes the unit delay blocks each comprising: a common delay circuit configured to delay an input signal inputted to a common input node and output a delayed signal to a common output node in response to a delay control code; a first delay circuit configured to delay an input signal inputted through either the common input node or a first input node, and output a delayed signal to a first output node in response to the delay control code; and a second delay circuit configured to delay an input signal inputted through either the common input node or a second input node, and output a delayed signal to a second output node in response to the delay control code.

In accordance with still another embodiment of the present invention, a semiconductor device having delay lines formed of a plurality of series-coupled unit delay blocks includes the unit delay blocks each comprising: a first delay logic block configured to receive a signal through a first signal input node, delay the received signal, and output a delayed signal to a first signal output node or a signal transfer node in response to a first delay control code; a second delay logic block configured to receive a signal through the first signal input node in response to a second delay control code or receive a signal through a second signal input node in response to an inverted signal of the second delay control code, delay the received signal, and output a delayed signal to a second signal output node; and a third delay logic block configured to receive a signal through the first signal transfer node in response to a third delay control code or receive a signal through a third signal input node in response to an inverted signal of the third delay control code, delay the received signal, and output a delayed signal to a third signal output node.

DESCRIPTION OF SPECIFIC EMBODIMENTS

Figure 1:
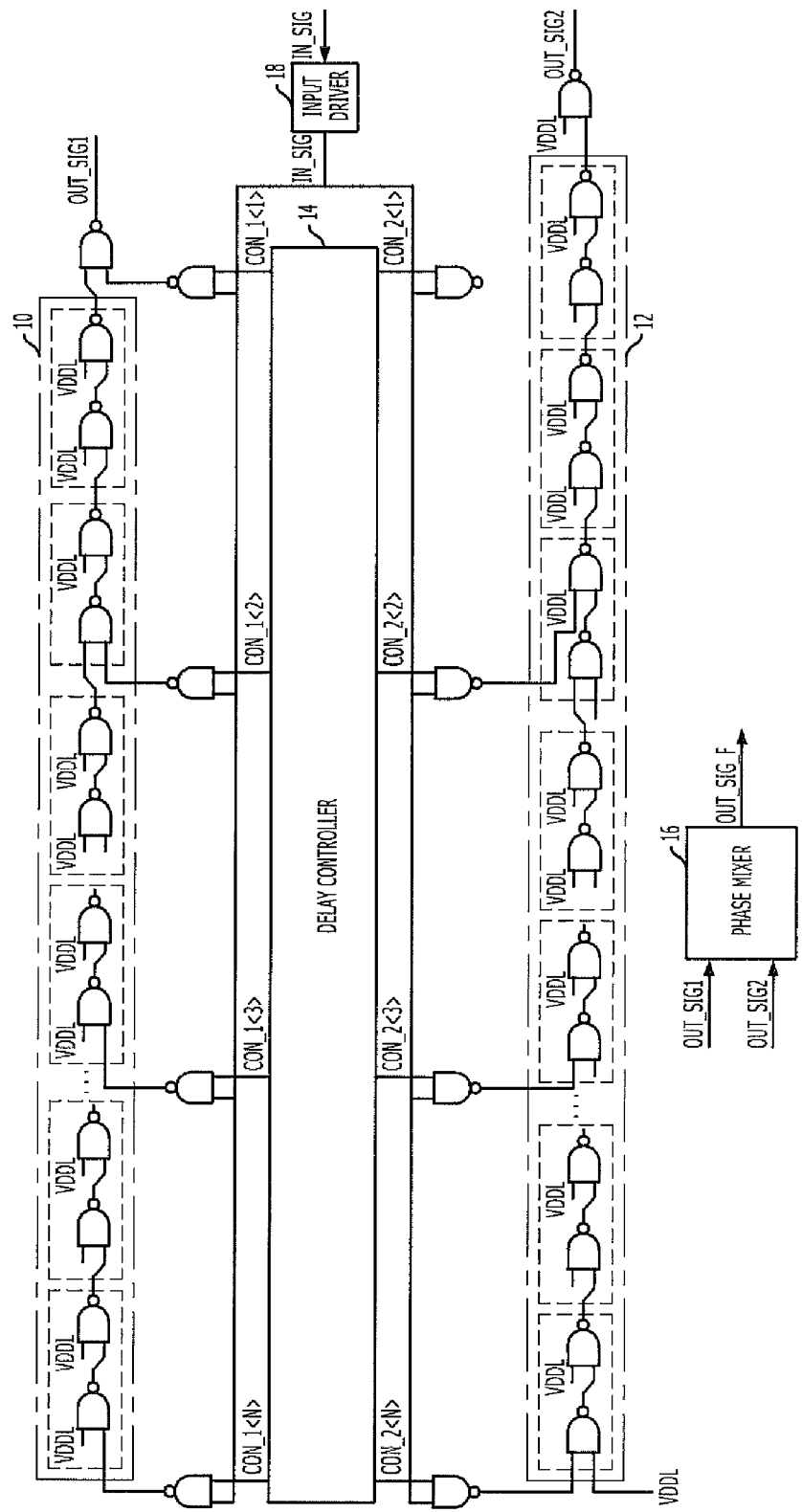
FIG. 1 is a block diagram illustrating a conventional semiconductor device having delay lines.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

$1^{ST}$ Embodiment

Figure 2:
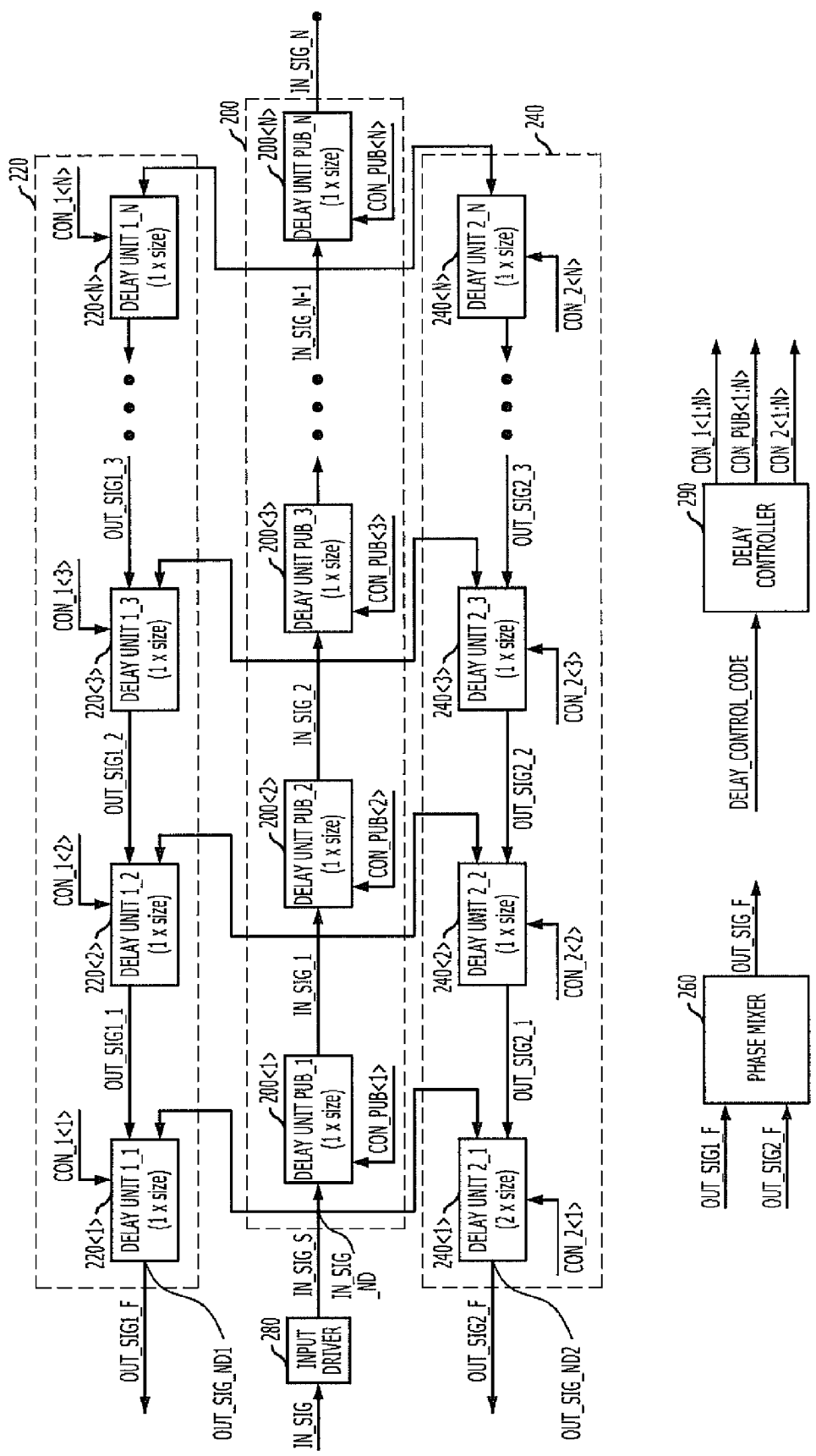
FIG. 2 is a block diagram illustrating a semiconductor device having delay lines in accordance with a first embodiment of the present invention.

FIG. 2 is a block diagram illustrating a semiconductor device having delay lines in accordance with a first embodiment of the present invention.

Referring to FIG. 2, the semiconductor device having delay lines includes a common delay circuit 200, a first delay circuit 220, and a second delay circuit 240. A common delay path of input signals IN_SIG_S, IN_SIG_1, IN_SIG_2, . . . , IN_SIG_N through the common delay circuit 200 is determined in response to delay control codes CON_PUB<1>, CON_PUB<2>, . . . , CON_PUB<N>, CON_1<1>, CON_1<2>, . . . , CON_1<N>, CON_2<1>, CON_2<2>, . . . , CON_2<N>. A first delay path through the first delay circuit 220 that input signals IN_SIG_S, IN_SIG_1, IN_SIG_2, . . . , IN_SIG_N transferred from the common delay circuit pass through is determined in response to the delay control codes CON_PUB<1>, CON_PUB<2>, . . . , CON_PUB<N>, CON_1<1>, CON_1<2>, . . . , CON_1<N>, CON_2<1>, CON_2<2>, . . . , CON_2<N>. A second delay path through the second delay circuit 240 that the input signals IN_SIG_S, IN_SIG_1, IN_SIG_2, . . . , IN_SIG_N transferred from the common delay circuit pass through is determined in response to the delay control codes CON_PUB<1>, CON_PUB<2>, . . . , CON_PUB<N>, CON_1<1>, CON_1<2>, . . . , CON_1<N>, CON_2<1>, CON_2<2>, . . . , CON_2<N>. The length of the second delay path is determined to be different from the length of the first delay path by a predetermined length. Also, the semiconductor device having delay lines further includes a phase mixer 260 for mixing the phase of an output signal OUT_SIG1_F outputted from the first delay circuit 220 with the phase of an output signal OUT_SIG2_F outputted from the second delay circuit 240. Also, the semiconductor device having delay lines further includes an input driver 280 for driving an external input signal IN_SIG to a signal input node IN_SIG_ND of the delay lines.

The delay control codes CON_PUB<1>, CON_PUB<2>, . . . , CON_PUB<N>, CON_1<1>, CON_1<2>, . . . , CON_1<N>, CON_2<1>, CON_2<2>, . . . , CON_2<N> are generated in a delay controller 290. The delay control codes CON_PUB<1>, CON_PUB<2>, . . . , CON_PUB<N>, CON_1<1>, CON_1<2>, . . . , CON_1<N>, CON_2<1>, CON_2<2>, . . . , CON_2<N> include common delay control codes CON_PUB<1>, CON_PUB<2>, . . . , CON_PUB<N> for controlling the operation of the common delay circuit 200, first delay control codes CON_1<1>, CON_1<2>, . . . , CON_1<N> for controlling the operation of the first delay circuit 220, and second delay control codes CON_2<1>, CON_2<2>, . . . , CON_2<N> for controlling the operation of the second delay circuit 240.

The common delay circuit 200 includes a plurality of common delay units 200<1>, 200<2>, . . . , 200<N> for delaying the input signal IN_SIG_S transferred through the signal input node IN_SIG_ND on the basis of a delay unit.

Herein, the common delay units 200<1>, 200<2>, . . . 200<N> perform an operation in response to the common delay control codes CON_PUB<1>, CON_PUB<2>, . . . , CON_PUB<N>. To be specific, when the common delay control codes CON_PUB<1>, CON_PUB<2>, . . . , CON_PUB<N> transferred to the common delay units 200<1>, 200<2>, . . . , 200<N> are enabled, input signals IN_SIG_S, IN_SIG_1, IN_SIG_2, . . . , IN_SIG_N−1 transferred from the signal input node IN_SIG_ND or the preceding common delay units 200<1>, 200<2>, . . . , 200<N−1> are delayed by a delay unit, respectively. When the common delay control codes CON_PUB<1>, CON_PUB<2>, . . . , CON_PUB<N> transferred to the respective common delay units 200<1>, 200<2>, . . . , 200<N> are disabled, input signals IN_SIG_S, IN_SIG_1, IN_SIG_2, . . . , IN_SIG_N−1 transferred from the signal input node IN_SIG_ND or the preceding common delay units 200<1>, 200<2>, . . . , 200<N−1> are not passed through.

The first delay circuit 220 includes a plurality of first delay units 220<1>, 220<2>, . . . , 220<N> for delaying the input signal IN_SIG_S transferred through the signal input node IN_SIG_ND or the input signals IN_SIG_1, IN_SIG_2, . . . , IN_SIG_N−1 transferred from the common delay units 200<1>, 200<2>, . . . , 200<N−1> included in the common delay circuit 200 on the basis of a delay unit.

Herein, the plurality of the first delay units 220<1>, 220<2>, . . . , 220<N> perform an operation in response to the first delay control codes CON_1<1>, CON_1<2>, . . . , CON_1<N>. To be specific, when any one of the first delay control codes among the first delay control codes CON_1<1>, CON_1<2>, . . . , CON_1<N> transferred to the first delay units 220<1>, 220<2>, . . . , 220<N> is enabled, the first delay units corresponding to the enabled first delay control code delay the input signals transferred from the preceding first delay units for a delay unit, and the first delay units corresponding to the other first delay control codes which are not enabled among the first delay control codes CON_1<1>, CON_1<2>, . . . , CON_1<N> transferred to the first delay units 220<1>, 220<2>, . . . , 220<N> delays an input signal transferred from any one common delay unit of the common delay circuit 200 or the input signal IN_SIG_S transferred through the signal input node IN_SIG_ND for a delay unit.

The second delay circuit 240 includes one second delay unit 240<1> for delaying the input signal IN_SIG_S transferred through the signal input node IN_SIG_ND or the input signals IN_SIG_1, IN_SIG_2, . . . , IN_SIG_N−1 transferred from the common delay units 200<1>, 200<2>, . . . , 200<N−1> of the common delay circuit 200 for two delay units; and a plurality of second delay units 240<2>, 240<3>, . . . , 240<N> for delaying them for a delay unit.

Herein, the second delay unit 240<1> and the other second delay units 240<2>, 240<3>, . . . , 240<N> perform an operation in response to the second delay control codes CON_2<1>, CON_2<2>, . . . , CON_2<N>. To be specific, when the second delay control code CON_2<1> transferred to the second delay unit 240<1> is enabled, an output signal OUT_SIG2_1 of the second delay unit 240<2> is delayed for two delay units. When the second delay control code CON_2<1> transferred to the second delay unit 240<1> is disabled, the input signal IN_SIG_S transferred through the signal input node IN_SIG_ND is delayed for two delay units. Also, when any one among the second delay control codes CON_2<2>, CON_2<3>, . . . , CON_2<N> transferred to the plurality of the second delay units 240<2>, 240<3>, . . . , 240<N> is enabled, the second delay units corresponding to the enabled second delay control code delay the input signal transferred from the preceding second delay units positioned for a delay unit. The second delay unit corresponding to the other second delay control codes which are not enabled among the second delay control codes CON_2<2>, CON_2<3>, . . . , CON_2<N> transferred to the respective second delay units 240<2>, 240<3>, . . . , 240<N> delays the input signal transferred from any one common delay unit of the common delay circuit 200 for a delay unit.

In reference to the above-described, an operation of a delay circuit of the semiconductor device fabricated in accordance with the first embodiment of the present invention will be described hereafter.

First, an operation of the common delay circuit 200 will be described. When the common delay control codes CON_PUB<1>, CON_PUB<2>, . . . , CON_PUB<N> are enabled, the plurality of the common delay units 200<1>, 200<2>, . . . , 200<N> included in the common delay circuit 200 receive the input signals IN_SIG_S, IN_SIG_1, IN_SIG_2, . . . , IN_SIG_N, delay them for a delay unit, and output delayed signals. When the common delay control codes CON_PUB<1>, CON_PUB<2>, . . . , CON_PUB<N> are disabled, the plurality of the common delay units 200<1>, 200<2>, . . . , 200<N> included in the common delay circuit 200 do not transfer the input signals IN_SIG_S, IN_SIG_1, IN_SIG_2, . . . , IN_SIG_N. Thus, the plurality of the common delay units 200<1>, 200<2>, . . . , 200<N> do not perform a delay operation when the common delay control codes CON_PUB<1>, CON_PUB<2>, . . . , CON_PUB<N> are disabled.

In other words, whether the common delay control codes CON_PUB<1>, CON_PUB<2>, . . . , CON_PUB<N> are enabled or disabled determines whether or not the plurality of the common delay units 200<1>, 200<2>, . . . , 200<N> included in the common delay circuit 200 receive input signals transferred thereto. Therefore, if any one bit among multi-bit common delay control codes CON_PUB<1>, CON_PUB<2>, . . . , CON_PUB<N> is selectively enabled as the highest enabled bit, bits for lower units are also all enabled while bits for higher units are all disabled.

For example, when it is assumed that the third common delay control code CON_PUB<3> among the common delay control codes CON_PUB<1>, CON_PUB<2>, . . . , CON_PUB<N> is selectively enabled as the highest enabled bit, the first and second common delay control codes CON_PUB<1> and CON_PUB<2>, which are of units lower than the third common delay control code CON_PUB<3>, are enabled, while the fourth to the $N^{th}$ common delay control codes CON_PUB<4>, CON_PUB<5>, . . . , CON_PUB<N>, which are of units higher than the third common delay control code CON_PUB<3>, are disabled.

When the first to third common delay control codes CON_PUB<1>, CON_PUB<2> and CON_PUB<3> among the common delay control codes CON_PUB<1>, CON_PUB<2>, . . . , CON_PUB<N> are enabled and the fourth to the $N^{th}$ common delay control codes CON_PUB_4>, CON_PUB<5>, . . . , CON_PUB<N> are disabled as shown in the above example, the common delay circuit 200 performs an operation of delaying the input signal IN_SIG_S transferred through the signal input node IN_SIG_ND in three delaying steps (each step delaying the received signal by a delay unit) through the first to third common delay units 200<1>, 200<2> and 200<3> and outputting signals IN_SIG_1, IN_SIG_2 and IN_SIG_3.

On the other hand, since the fourth to $N^{th}$ common delay units 200<4>, 200<5>, . . . , 200<N> do not perform a delay operation, the output signals are set with no regard to the input signal IN_SIG_S transferred through the signal input node IN_SIG_ND. The output signals are usually set to a logic low level.

When the operation of the common delay circuit 200 is initialized, the common delay circuit 200 does not delay the input signal IN_SIG_S in response to the initial value of the common delay control codes CON_PUB<1>, CON_PUB<2>, . . . , CON_PUB<N>, having a state where all common delay control codes are disabled, and outputs the input signal IN_SIG_S without any delay, and the common delay circuit 200 increases the delay unit for the input signal IN_SIG_S in response to the common delay control codes CON_PUB<1>, CON_PUB<2>, . . . , CON_PUB<N>.

Herein, a signal IN_SIG_N outputted from the highest $N^{th}$ common delay unit 200<N> among the plurality of the common delay units 200<1>, 200<2>, . . . , 200<N> included in the common delay circuit 200 shown in FIG. 2 is not inputted to the first delay circuit 220 and the second delay circuit 240 and it remains disconnected and does not perform any substantial function. Alternatively, the signal IN_SIG_N may be simultaneously inputted to both first delay circuit 220 and second delay circuit 240, or the common delay circuit 200 may be designed as if the $N^{th}$ common delay unit 200<N> for generating the signal IN_SIG_N does not exist. In short, the common delay circuit 200 may be used in a different ways than in the exemplary embodiment of the present invention.

Hereafter, an operation of the first delay circuit 220 will be described. When the first delay control codes CON_1<1>, CON_1<2>, . . . , CON_1<N> are enabled, the plurality of the first delay units 220<1>, 220<2>, . . . , 220<N> included in the first delay circuit 220 receive the output signals OUT_SIG1_1, OUT_SIG1_2, . . . , OUT_SIG1_N of the preceding first delay units 220<2>, 220<3>, . . . , 220<N>, delay the output signals OUT_SIG1_1, OUT_SIG1_2, . . . , OUT_SIG1_N for a delay unit, and outputs delayed signals. When the first delay control codes CON_1<1>, CON_1<2>, . . . , CON_1<N> are disabled, the plurality of the first delay units 220<1>, 220<2>, . . . , 220<N> included in the first delay circuit 220 receive the input signal IN_SIG_S transferred from the signal input node IN_SIG_ND or input signals IN_SIG_1, IN_SIG_2, . . . , IN_SIG_N−1 transferred from the plurality of the common delay units 200<1>, 200<2>, . . . , 200<N−1> included in the common delay circuit 200, delay them for a delay unit, and output delayed signals.

To sum up, a determination as to which of the two signals the first delay units 220<1>, 220<2>, . . . , 220<N> will pass through depends on whether the first delay control codes CON_1<1>, CON_1<2>, . . . , CON_1<N> are enabled or disabled. Therefore, when any one bit among the multi-bit first delay control codes CON_1<1>, CON_1<2>, ..., CON_1<N> is selectively enabled as the highest enabled bit, bits of units lower than the enabled bit are all enabled, while bits of unit higher than the enabled bit are all disabled.

For example, when it is assumed that the third first delay control code CON_1<3> among the first delay control codes CON_1<1>, CON_1<2>, ..., CON_1<N> is selectively enabled as the highest enabled bit, the first and second first delay control codes CON_1<1> and CON_1<2>, which are for units lower than that of the highest enabled third first delay control code CON_1<3>, are enabled, while the fourth to $N^{th}$ first delay control codes CON_1<4>, CON_1<5>, ..., CON_1<N>, which are for units higher than that of the highest enabled third first delay control code CON_1<3>, are disabled.

As shown in the above example, when the first to third first delay control codes CON_1<1>, CON_1<2> and CON_1<3> among the first delay control codes CON_1<1>, CON_1<2>, ..., CON_1<N> are enabled and the remaining fourth to $N^{th}$ first delay control codes CON_1<4>, CON_1<5>, ..., CON_1<N> are disabled, the fourth delay circuit 220<4> performs an operation of receiving an input signal IN_SIG_3 transferred through the third common delay unit 200<3>, delaying the received input signal IN_SIG_3 for a delay unit, and outputting a delayed signal. Also, the first to third first delay units 220<1>, 220<2> and 220<3> respectively perform an operation of receiving output signals OUT_SIG1_1, OUT_SIG1_2, OUT_SIG1_3 of the preceding second to fourth first delay units 220<2>, 220<3> and 220<4>, delaying the received signals OUT_SIG1_1, OUT_SIG1_2, OUT_SIG1_3 for a delay unit, and outputting delayed signals OUT_SIG1_S, OUT_SIG1_1, and OUT_SIG1_2. In short, among the plurality of the first delay units 220<1>, 220<2>, ..., 220<N> included in the first delay circuit 220, the input signal IN_SIG_3 that has passed through the common delay circuit 200 and been transferred to the fourth first delay unit 220<4> is delayed in four delaying steps (each step for delaying by a delay unit) as it passes through the fourth to first, first delay units 220<4>, 220<3>, 220<2>, and 220<1> to thereby output signals OUT_SIG1_3, OUT_SIG1_2, and OUT_SIG1_1, and OUT_SIG1_F.

On the other hand, although the fifth to $N^{th}$ first delay units 220<5>, 220<6>, ..., 220<N> receive the first delay control codes CON_1<5>, CON_1<6>, ..., CON_1<N> corresponding thereto through the common delay circuit 200, the signals transferred from the common delay circuit 200 are insignificant signals whose level is set with no regard to the input signal IN_SIG_S transferred through the signal input node IN_SIG_ND. Therefore, the output signals are insignificant signals whose level is set with no regard to the input signal IN_SIG_S transferred through the signal input node IN_SIG_ND. The signals transferred from the common delay circuit 200 are usually set to a logic low level.

When the operation of the first delay circuit 220 is initialized, the first delay circuit 220 delays the input signal IN_SIG_S (which is a signal outputted without any delay) transferred from the common delay circuit 200 for a delay unit in response to the initial value of the first delay control codes CON_1<1>, CON_1<2>, ..., CON_1<N>, having a state where all first delay control codes are disabled. The first delay circuit 220 selectively passes through the input signals IN_SIG_1, IN_SIG_2, and IN_SIG_N-1 transferred from the common delay circuit 200 in response to the first delay control codes CON_1<1>, CON_1<2>, ..., CON_1<N>. The one-unit increase of the values of the first delay control codes CON_1<1>, CON_1<2>, ..., CON_1<N> signifies that the next higher bits of the first delay control codes CON_1<1>, CON_1<2>, ..., CON_1<N> are sequentially enabled.

Herein, it may be seen from the above that the first delay circuit 220 directly receives the input signal IN_SIG_S transferred through the signal input node IN_SIG_ND in the state of the initial value where all of the first delay control codes CON_1<1>, CON_1<2>, ..., CON_1<N> are disabled. During the initialization, the input signal IN_SIG_S is outputted without any delay in the state of the initial value where all the common delay control codes CON_PUB<1>, CON_PUB<2>, ..., CON_PUB<N> are disabled.

Hereafter, an operation of the second delay circuit 240 will be described. The plurality of the second delay units 240<1>, 240<2>, 240<3>, ..., 240<N> included in the second delay circuit 240 receive the output signals OUT_SIG2_1, OUT_SIG2_2, ..., OUT_SIG2_N transferred from the preceding second delay units 240<2>, 240<3>, ..., 240<N>, when the second delay control codes CON_2<1>, CON_2<2>, ..., CON_2<N> are enabled, delay the received output signals OUT_SIG2_1, OUT_SIG2_2, ..., OUT_SIG2_N on for two delay units or one delay unit, and output delayed signals. Also, when the second delay control codes CON_2<1>, ..., CON_2<2>, ..., CON_2<N> are disabled, the second delay circuit 240 delays the input signal IN_SIG_S transferred from the signal input node IN_SIG_ND for two delay units and outputs the delayed signal, or it receives the input signals IN_SIG_1, IN_SIG_2, ..., IN_SIG_N-1 transferred from the plurality of the common delay units 200<1>, 200<2>, ..., 200<N-1> included in the common delay circuit 200, delays them for a delay unit, and outputs delayed signals.

In other words, a determination as to which of the two signals the second delay units 240<1>, 240<2>, 240<3>, ..., 240<N> will receive depends on whether the second delay control codes CON_2<1>, CON_2<2>, ..., CON_2<N> are enabled or disabled. Therefore, when any one bit among the multi-bit second delay control codes CON_2<1>, CON_2<2>, ..., CON_2<N> is selectively enabled as the highest enabled bit, bits of units lower than the highest enabled bit are all enabled, while bits of units higher than the highest enabled bit are all disabled.

For example, when it is assumed that the third, second delay control code CON_2<3> among the second delay control codes CON_2<1>, CON_2<2>, ..., CON_2<N> is selectively enabled as the highest enabled bit, the first and second, second delay control codes CON_2<1> and CON_2<2>, which are of units lower than the highest enabled code, are enabled while the fourth to $N^{th}$ second delay control codes CON_2<4>, CON_2<5>, ..., CON_2<N>, which are of units higher than the highest enabled code, are disabled.

As described in the above example, when the first to third second delay control codes CON_2<1>, CON_2<2> and CON_2<3> among the second delay control codes CON_2<1>, CON_2<2>, ..., CON_2<N> are enabled and the remaining fourth to $N^{th}$ second delay control codes CON_2<4>, CON_2<5>, ..., CON_2<N> are disabled, the second delay circuit 240 receives the input signal IN_SIG_3 transferred through the third common delay unit 200<3> among the plurality of the common delay units 200<1>, 200<2>, ..., 200<N>, delays the received input signal IN_SIG_3 for a delay unit, outputs an output signal OUT_SIG2_3. Meanwhile, the second delay circuit 240 receives the output signals OUT_SIG2_2 and OUT_SIG2_3 of the preceding third and fourth second delay units 240<3> and 240<4>, delays the received output signals OUT_SIG2_2 and OUT_SIG2_3 for a delay unit, and outputs output signals OUT_SIG2_1 and OUT_SIG2_2. Also, the second delay circuit 240 receives the output signal OUT_SIG2_1 transferred from the second, second delay unit 240<2> delays the received output signals OUT_SIG2_2 for two delay units, and outputs an output signal OUT_SIG2_S.

In other words, the input signal IN_SIG_3 transferred to the fourth, first delay unit 240<4> is delayed in three delaying steps (each step for delaying by a delay unit) through the fourth to second, second delay units 240<4>, 240<3> and 240<2>, and then delayed again in two delaying steps (each delaying step for delaying by a delay unit) through the first, second delay unit 240<1>, and outputs output signals OUT_SIG1_3, OUT_SIG1_2, OUT_SIG1_1 and OUT_SIG1_F.

On the other hand, although the fifth to $N^{th}$ second delay units 240<5>, 240<6>, . . . , 240<N> receive corresponding second delay control codes CON_2<5>, CON_2<6>, . . . , CON_2<N> through the common delay circuit 200, the signals transferred from the common delay circuit 200 are insignificant signals whose level is set with no regard to the input signal IN_SIG_S transferred through the signal input node IN_SIG_ND. Therefore, the output signals are insignificant signals whose level is set with no regard to the input signal IN_SIG_S transferred through the signal input node IN_SIG_ND as well. The level of the signals transferred from the common delay circuit 200 is usually set to a logic low.

When the operation of the second delay circuit 240 is initialized, the second delay circuit 240 delays the input signal IN_SIG_S (which is a signal outputted without any delay) transferred from the common delay circuit 200 for two delay units in response to the initial value of the second delay control codes CON_2<1>, CON_2<2>, . . . , CON_2<N>, having a state where all the second delay control codes are disabled. The second delay circuit 240 selectively passes through the input signals IN_SIG_1, IN_SIG_2, and IN_SIG_N transferred from the common delay circuit 200 in response to a one-unit increase of the values of the second delay control codes CON_2<1>, CON_2<2>, . . . , CON_2<N>. The one-unit increase of the values of the second delay control codes CON_2<1>, CON_2<2>, . . . , CON_2<N> signifies that the next higher bits of the second delay control codes CON_2<1>, CON_2<2>, . . . , CON_2<N> are sequentially enabled from the first second delay control code CON_2<1>.

Herein, it may be seen from the above that the second delay circuit 240 directly receives the input signal IN_SIG_S transferred through the signal input node IN_SIG_ND in the state of the initial value where all the second delay control codes CON_2<1>, CON_2<2>, . . . , CON_2<N> are disabled. During the initialization, the input signal IN_SIG_S is outputted without any delay in the state of the initial value where all the common delay control codes CON_PUB<1>, CON_PUB<2>, . . . , CON_PUB<N> are disabled.

As described above, when the common delay circuit 200, the first delay circuit 220 and the second delay circuit 240 operate, the relationship between signals finally outputted is as follows. The output signal OUT_SIG1_F finally outputted from the first delay circuit 220 is delayed in, for example, three delaying steps (each delaying step for delaying by a delay unit) through the common delay circuit 200 and then delayed again in, for example, four delaying steps (each step for delaying by a delay unit) through the first delay circuit 220. Therefore, the output signal OUT_SIG1_F finally outputted from the first delay circuit 220 is a signal delayed in by a total of seven steps, in comparison to the input signal IN_SIG_S transferred to the common delay circuit 200.

Also, the output signal OUT_SIG2_F finally outputted from the second delay circuit 240 is delayed in, for example, three delaying steps (each delaying step for delaying by a delay unit) through the common delay circuit 200 just as the output signal OUT_SIG1_F finally outputted from the first delay circuit 220, and then delayed again in, for example, five delaying steps (each delaying step for delaying by a delay unit) through the second delay circuit 240. Therefore, the output signal OUT_SIG2_F finally outputted from the second delay circuit 240 is a signal obtained by delaying, through a total of eight delaying steps, the input signal IN_SIG_S transferred to the common delay circuit 200 through the signal input node IN_SIG_ND.

In describing the delay lines of the semiconductor device fabricated in accordance with the first embodiment of the present invention, according to an exemplary embodiment, the values of the common delay control codes CON_PUB<1>, CON_PUB<2>, . . . , CON_PUB<N>, the first delay control codes CON_1<1>, CON_1<2>, . . . , CON_1<N>, and the second delay control codes CON_2<1>, CON_2<2>, . . . , CON_2<N>, which are included in the delay control codes CON_PUB<1>, CON_PUB<2>, . . . , CON_PUB<N>, CON_1<1>, CON_1<2>, . . . , CON_1<N>, CON_2<1>, CON_2<2>, . . . , CON_2<N>, are the same. This signifies that codes at the same positions of the common delay control codes, first delay control codes, and the second delay control codes are enabled and the other codes are disabled. To be specific, when the first to third common delay control codes CON_PUB<1>, CON_PUB<2> and CON_PUB<3> are enabled among the common delay control codes CON_PUB<1>, CON_PUB<2>, . . . , CON_PUB<N>, and the remaining fourth to $N^{th}$ common delay control codes CON_PUB<4>, CON_PUB<5>, . . . , CON_PUB<N> are disabled, it is assumed that the first to third first delay control codes CON_1<1>, CON_1<2> and CON_1<3> are enabled among the first delay control codes CON_1<1>, CON_1<2>, . . . , CON_1<N>, while the remaining fourth to $N^{th}$ first delay control codes CON_1<4>, CON_1<5>, . . . , CON_1<N> are disabled; and that the first to third second delay control codes CON_2<1>, CON_2<2> and CON_2<3> are enabled among the second delay control codes CON_2<1>, CON_2<2>, . . . , CON_2<N>, while the remaining fourth to $N^{th}$ second delay control codes CON_2<4>, CON_2<5>, . . . , CON_2<N> are disabled.

However, in this state, the output signal OUT_SIG2_F finally outputted from the second delay circuit 240 is always delayed more than the output signal OUT_SIG1_F finally outputted from the first delay circuit 220 by one delay unit.

Therefore, according to an exemplary embodiment, the common delay control codes CON_PUB<1>, CON_PUB<2>, . . . , CON_PUB<N> may have the same value as the first delay control codes CON_1<1>, CON_1<2>, . . . , CON_1<N> and a greater value than the values of the second delay control codes CON_2<1>, CON_2<2>, . . . , CON_2<N> by a value corresponding to one delay unit. To be specific, when it is assumed that the first to third common delay control codes CON_PUB<1>, CON_PUB<2> and CON_PUB<3> are enabled among the common delay control codes CON_PUB<1>, CON_PUB<2>, . . . , CON_PUB<N> and the remaining fourth to $N^{th}$ common delay control codes CON_PUB<4>, CON_PUB<5>, . . . , CON_PUB<N> are disabled, the first to third first delay control codes CON_1<1>, CON_1<2> and CON_1<3> are enabled among the first delay control codes CON_1<1>, CON_1<2>, . . . , CON_1<N>, while the remaining fourth to $N^{th}$ first delay control codes CON_1<4>, CON_1<5>, . . . , CON_1<N> are disabled; and the first and second, second delay control codes CON_2<1> and CON_2<2> are enabled among the second delay control codes CON_2<1>, CON_2<2>, . . . , CON_2<N>, while the remaining third to $N^{th}$ second delay control codes CON_2<3>, CON_2<4>, CON_2<5>, ..., CON_2<N> are disabled.

As described above, when the values of the delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N> are changed, the output signal OUT_SIG1_F finally outputted from the first delay circuit 220 is delayed in, for example, three delaying steps (each delaying step for delaying by a delay unit) through the common delay circuit 200 and then delayed again in, for example, four delaying steps (each delaying step for delaying by a delay unit) through the first delay circuit 220. Therefore, the final output signal OUT_SIG1_F becomes a signal obtained by delaying, through seven delaying steps (each delaying step for delaying by a delay unit), the input signal IN_SIG_S transferred to the common delay circuit 200 through the signal input node IN_SIG_ND.

Also, the output signal OUT_SIG2_F finally outputted from the second delay circuit 240 is delayed in, for example, two delaying steps (each delaying step for delaying by a delay unit) through the common delay circuit 200, in contrast to the output signal OUT_SIG1_F finally outputted from the first delay circuit 220, and then delayed again in four steps (each step for delaying by a delay unit) through the second delay circuit 240. Therefore, the final output signal OUT_SIG2_F becomes a signal obtained by delaying, through six steps (each step for delaying by a delay unit), the input signal IN_SIG_S transferred to the common delay circuit 200 through the signal input node IN_SIG_ND.

To sum up, through the operation of changing the delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N>, the output signal OUT_SIG2_F finally outputted from the second delay circuit 240 may be ahead of the output signal OUT_SIG1_F finally outputted from the first delay circuit 220 by a delay unit.

Like the conventional technology, the phase mixer 260 may generate an output signal OUT_SIG_F having a delay amount smaller than the delay unit by mixing the phase of the final output signal OUT_SIG1_F of the first delay circuit 220 with the phase of the final output signal OUT_SIG2_F of the second delay circuit 240. The final output signal OUT_SIG1_F of the first delay circuit 220 and the final output signal OUT_SIG2_F of the second delay circuit 240 may have a difference of one delay unit.

According to the first embodiment of the present invention described above, the input signal IN_SIG_S transferred through the signal input node IN_SIG_ND of delay lines is delayed for a predetermined delay amount in the common delay circuit 200, and then delayed again for predetermined delay amounts while passing through the first delay circuit 220 and the second delay circuit 240 to be thereby outputted as two output signals OUT_SIG1_F and OUT_SIG2_F through two output nodes OUT_SIG_ND1 and OUT_SIG_ND2.

Therefore, when the input signal IN_SIG_S is transferred to the signal input node IN_SIG_ND through the input driver 280, it has a state dependent on the loads of the common delay circuit 200. Thus, it is possible not only to minimize the level change of the input signal IN_SIG_S but also to minimize the size of the input driver 280. As a result, the input signal IN_SIG_S can pass through the delay lines at a high accuracy and have a fast response time.

Therefore, the delay lines according to the first embodiment of the present invention can be applied to a semiconductor device operating faster than conventional semiconductor devices.

$2^{ND}$ Embodiment

Figure 3:
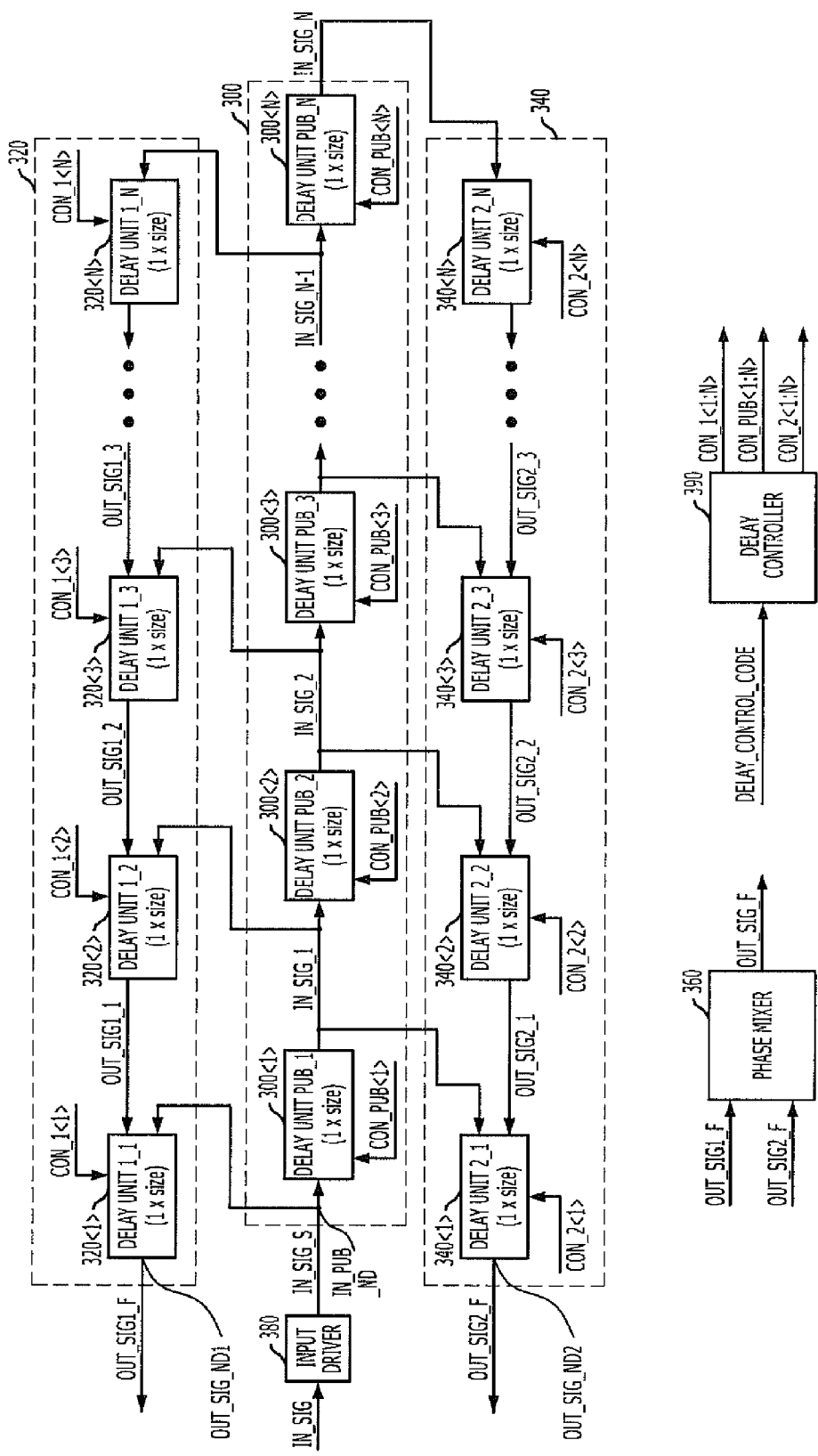
FIG. 3 is a block diagram illustrating a semiconductor device having delay lines in accordance with a second embodiment of the present invention.

FIG. 3 is a block diagram illustrating a semiconductor device having delay lines in accordance with a second embodiment of the present invention.

Referring to FIG. 3, the semiconductor device having delay lines includes an input delay circuit 300, a first output delay circuit 320, and a second output delay circuit 340. The input delay circuit 300 generates a first delay signal by delaying an input signal IN_SIG_S through a common delay path whose length is determined in response to delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N>; and generates a second delay signal by delaying the first delay signal generated in the common delay path through an additional delay path whose length is determined in response to the delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N>. The first output delay circuit 320 delays the first delay signal of the input delay circuit 300 through a first delay path whose length is determined in response to the delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N>, and outputs a delayed first delay signal. The second output delay circuit 340 delays a signal of the input delay circuit 300 through a second delay path whose length is determined in response to the delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N>, and outputs a delayed signal.

Also, the semiconductor device having delay lines further includes a phase mixer 360 for mixing the phase of an output signal OUT_SIG1_F outputted from the first output delay circuit 320 and the phase of a second output signal OUT_SIG2_F outputted from the second output delay circuit 340. Also, the semiconductor device having delay lines further includes an input driver 380 for driving an external input signal IN_SIG to a signal input node IN_SIG_ND.

The delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N> are generated in a delay controller 390. The delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N> include input delay control codes CON_PUB<1>, CON_PUB<2>, ..., CON_PUB<N> for controlling the operation of the input delay circuit 300, first delay control codes CON_1<1>, CON_1<2>, ..., CON_1<N> for controlling the operation of the first output delay circuit 320, and second delay control codes CON_2<1>, CON_2<2>, ..., CON_2<N> for controlling the operation of the second output delay circuit 340.

The input delay circuit 300 includes a plurality of input delay units 300<1>, 300<2>, ..., 300<N> for delaying the input signal IN_SIG_S transferred through the signal input node IN_SIG_ND by a delay unit. To be specific, when the input delay control codes CON_PUB<1>, CON_PUB<2>, ..., CON_PUB<N> transferred to the input delay units 300<1>, 300<2>, ..., 300<N> are enabled, input signals IN_SIG_S, IN_SIG_1, IN_SIG_2, ..., IN_SIG_N−1 transferred from the signal input node IN_SIG_ND or the preceding input delay units 300<1>, 300<2>, ..., 300<N−1> are delayed on by a delay unit, respectively. When the input delay control codes CON_PUB<1>, CON_PUB<2>, ..., CON_PUB<N> transferred to the respective input delay units 300<1>, 300<2>, ..., 300<N> are disabled, input signals IN_SIG_S, IN_SIG_1, IN_SIG_2, ..., IN_SIG_N-1 transferred from the signal input node IN_SIG_ND or the preceding input delay units 300<1>, 300<2>, ..., 300<N-1> are not passed through.

The first output delay circuit 320 includes a plurality of first output delay units 320<1>, 320<2>, ..., 320<N> for delaying the input signal IN_SIG_S transferred through the signal input node IN_SIG_ND or the input signals IN_SIG_1, IN_SIG_2, ..., IN_SIG_N-1 transferred from the input delay units 300<1>, 300<2>, ..., 300<N-1> of the input delay circuit 300 on the basis of a delay unit.

Herein, the plurality of the first output delay units 320<1>, 320<2>, ..., 320<N> perform an operation in response to the first delay control codes CON_1<1>, CON_1<2>, ..., CON_1<N>. To be specific, when any one of the first delay control codes among the first delay control codes CON_1<1>, CON_1<2>, ..., CON_1<N> transferred to the first output delay units 320<1>, 320<2>, ..., 320<N> is enabled, and the first output delay units corresponding to the enabled first delay control codes delay an input signal transferred from the preceding first output delay units by a delay unit. On the other hand, the first output delay unit corresponding to the first delay control code which is not enabled among the first delay control codes CON_1<1>, CON_1<2>, ..., CON_1<N> transferred to the respective first output delay units 320<1>, 320<2>, ..., 320<N> delays the input signal transferred from any one input delay unit of the input delay circuit 300 or the input signal IN_SIG_S transferred through the signal input node IN_SIG_ND by a delay unit.

The second output delay circuit 340 includes a plurality of second output delay units 340<1>, 340<2>, ..., 340<N> for delaying the signals IN_SIG_1, IN_SIG_2, ..., IN_SIG_N transferred from the input delay units 300<1>, 300<2>, ..., 300<N> of the input delay circuit 300 by a delay unit.

Herein, the second output delay units 340<1>, 340<2>, 340<3>, ..., 340<N> perform an operation in response to the second delay control codes CON_2<1>, CON_2<2>, ..., CON_2<N>. To be specific, when any one second delay control code among the second delay control codes CON_2<1>, CON_2<2>, ..., CON_2<N> transferred to the second output delay units 340<1>, 340<2>, ..., 340<N> is enabled, the second output delay units corresponding to the enabled second delay codes delay the input signals transferred from the preceding second output delay units for a delay unit. The second output delay units corresponding to the remaining second delay control codes which are not enabled among the second delay control codes CON_2<1>, CON_2<2>, ..., CON_2<N> transferred to the second output delay units 340<1>, 340<2>, ..., 340<N> delay the input signals IN_SIG_1, IN_SIG_2, ..., IN_SIG_N transferred from any one input delay unit included in the input delay circuit 300 for a delay unit.

Herein, the plurality of the input delay units 300<1>, 300<2>, ...; 300<N> included in the input delay circuit 300 flexibly operate as a common delay path or an additional delay path based on the linkage relationship between the first output delay circuit 320 and the second output delay circuit 340, and based on the input delay control codes CON_PUB<1>, CON_PUB<2>, ..., CON_PUB<N>. First, the linkage relationship between the first and second output delay circuits 320 and 340 and the input delay circuit 300 will be described. The first output delay circuit 320 receives the input signals IN_SIG_S, IN_SIG_1, IN_SIG_2, ..., IN_SIG_N-1 transferred to the respective input delay units 300<1>, 300<2>, ..., 300<N> included in the input delay circuit 300 and performs a delay operation. The second output delay circuit 340 receives the input signals IN_SIG_1, IN_SIG_2, ..., IN_SIG_N outputted from the respective input delay units 300<1>, 300<2>, ..., 300<N> included in the input delay circuit 300 and performs a delay operation. To be specific, the input signals IN_SIG_S, IN_SIG_1, ..., IN_SIG_2, IN_SIG_N-1 transferred to the first output delay units 320<1>, 320<2>, ..., 320<N> included in the first output delay circuit 320 through the input delay circuit 300 are delayed less than the input signals IN_SIG_1, IN_SIG_2, ..., IN_SIG_N transferred to the second output delay units 340<1>, 340<2>, ..., 340<N> by one delay unit.

Therefore, in the plurality of the input delay units 300<1>, 300<2>, ..., 300<N> included in the input delay circuit 300, delay amounts to the delay amount of the input delay unit corresponding to the value of the input delay control code smaller by one delay unit than the greatest value of the enabled input delay control codes enabled among the input delay control codes CON_PUB<1>, CON_PUB<2>, ..., CON_PUB<N> become a portion where the delay mount of the input delay circuit 300 is commonly applied to the input signal transferred from the input delay circuit 300 to the first output delay circuit 320 and second output delay circuit 340. The portion is referred to as a common delay path. Herein, since the largest value of the input delay control codes enabled among the input delay control codes CON_PUB<1>, CON_PUB<2>, ..., CON_PUB<N> is not predetermined, the length of the common delay path is not predetermined.

Also, in the plurality of the input delay units 300<1>, 300<2>, ..., 300<N> included in the input delay circuit 300, the additional delay path is a portion whose delay is not applied to the input signal transferred from the input delay circuit 300 to the first output delay circuit 320 but to the input signal transferred from the input delay circuit 300 to the second output delay circuit 340. Herein, since the additional delay path comes to have the delay amount of one input delay unit, it can be understood that the delay amount is fixed to a delay amount corresponding to one delay unit.

In the above-described method, the plurality of input delay units 300<1>, 300<2>, ..., 300<N> included in the input delay circuit 300 may be divided into those for the common delay path and those for the additional delay path. The division, however, is made under the assumption that the first output delay circuit 320 and the second output delay circuit 340 have the same length. When the first output delay circuit 320 is longer than the second output delay circuit 340 by one delay unit, the entire input delay circuit 300 may become the common delay path. In other words, according to an example, the additional delay path may be fixed to a delay amount corresponding to one delay unit. Alternatively, the additional delay path may have no delay amount as well.

Therefore, when the first output delay circuit 320 and the second output delay circuit 340 have the same length, the second output delay circuit 340 delays a second delay signal generated through the additional delay path of the input delay circuit 300 and outputs a delayed second delay signal. On the other hand, when the first output delay circuit 320 is longer than the second output delay circuit 340 by one delay unit, the second output delay circuit 340 delays a first delay signal generated through the common delay path of the input delay circuit 300 and outputs a delayed first delay signal like the first output delay circuit 320. Herein, when the first output delay circuit 320 is longer than the second output delay circuit 340 by one delay unit, the input delay circuit 300 does not require any additional delay path. Thus, there is no second delay signal.

Based on the above-described structure, an operation of a delay circuit of the semiconductor device fabricated in accordance with the second embodiment of the present invention will be described hereafter.

First, an operation of the input delay circuit 300 will be described. When the input delay control codes CON_PUB<1>, CON_PUB<2>, CON_PUB<N> are enabled, the plurality of the input delay units 300<1>, 300<2>, ..., 300<N> included in the input delay circuit 300 receive the input signals IN_SIG_S, IN_SIG_1, IN_SIG_2, ..., IN_SIG_N-1, delay them by a delay unit, and output delayed signals, respectively. When the input delay control codes CON_PUB<1>, CON_PUB<2>, ..., CON_PUB<N> are disabled, the plurality of the input delay units 300<1>, 300<2>, ..., 300<N> included in the input delay circuit 300 do not pass through the input signals IN_SIG_S, IN_SIG_1, IN_SIG_2, ..., IN_SIG_N-1 applied thereto. Thus, the plurality of the input delay units 300<1>, 300<2>, ..., 300<N> do not perform a delay operation.

To be specific, whether the input delay control codes CON_PUB<1>, CON_PUB<2>, ..., CON_PUB<N> are enabled or disabled determines whether or not the plurality of the input delay units 300<1>, 300<2>, ..., 300<N> included in the input delay circuit 300 pass through the input signals transferred thereto. Therefore, if any one bit among multi-bit input delay control codes CON_PUB<1>, CON_PUB<2>, ..., CON_PUB<N> is selectively enabled as the highest enabled bit, bits of lower units are all enabled, while bits of higher units are all disabled.

For example, when it is assumed that the third input delay control code CON_PUB<3> among the input delay control codes CON_PUB<1>, CON_PUB<2>, ..., CON_PUB<N> is enabled as the highest enabled bit, the first and second input delay control codes CON_PUB<1> and CON_PUB<2>, which are of units lower than the third input delay control code CON_PUB<3>, are enabled, while the fourth to $N^{th}$ input delay control codes CON_PUB<4>, CON_PUB<5>, ..., CON_PUB<N>, which are of units higher than the third input delay control code CON_PUB<3>, are disabled.

In the above-described exemplary state, the common delay path and the additional delay path are divided in the input delay circuit 300 as follows.

First, when the values of the first delay control codes CON_1<1>, CON_1<2>, ..., CON_1<N> for determining the length of the first output delay circuit 320 are the same as the values of the input delay control codes CON_PUB<1>, CON_PUB<2>, ..., CON_PUB<N> of the input delay circuit 300 and the values of the second delay control codes CON_2<1>, CON_2<2>, ..., CON_2<N> for determining the length of the second output delay circuit 340 are smaller than the values of the input delay control codes CON_PUB<1>, CON_PUB<2>, ..., CON_PUB<N> of the input delay circuit 300 by a value corresponding to one delay unit, the length of the additional delay path becomes '0.' Thus, the first output delay circuit 320 and the second output delay circuit 340 receive the input signal outputted through the common delay path of the input delay circuit 300 together and perform a delay operation.

In short, just as the first to third input delay control codes CON_PUB<1>, CON_PUB<2> and CON_PUB<3> are enabled among the input delay control codes CON_PUB<1>, CON_PUB<2>, ...; CON_PUB<N>, when the first to third first delay control codes CON_1<1>, CON_1<2> and CON_1<3> are enabled among the first delay control codes CON_1<1>, CON_1<2>, ..., CON_1<N> and the first and second, second delay control codes CON_2<1> and CON_2<2> are enabled among the second delay control codes CON_2<1>, CON_2<2>, ..., CON_2<N>, the first to third input delay units 300<1>, 300<2> and 300<3> belong to the common delay path among the input delay units 300<1>, 300<2>, ..., 300<N> included in the input delay circuit 300. At the same time, the additional delay path is not necessary. Therefore, both first output delay circuit 320 and second output delay circuit 340 receive the input signal IN_SIG_3, which is a signal delayed in three steps each on the basis of a delay unit and outputted through the common delay path of the input delay circuit 300, and perform a delay operation.

On the other hand, when the values of the first delay control codes CON_1<1>, CON_1<2>, ..., CON_1<N> for determining the length of the first output delay circuit 320 and the values of the second delay control codes CON_2<1>, CON_2<2>, ..., CON_2<N> for determining the length of the second output delay circuit 340 have values corresponding to values that are one-delay-unit smaller than the values of the input delay control codes CON_PUB<1>, CON_PUB<2>, ..., CON_PUB<N> of the input delay circuit 300, the additional delay path comes to have the length corresponding to that of one delay unit. Thus, the first output delay circuit 320 receives the input signal outputted through the common delay path of the input delay circuit 300 and performs a delay operation. The second output delay circuit 340 receives the input signal through the additional path, where the input signal is delayed by one delay unit more than the input signal outputted through the common delay path and performs a delay operation.

To be specific, when the first and second first delay control codes CON_1<1> and CON_1<2> are enabled among the first delay control codes CON_1<1>, CON_1<2>, ..., CON_1<N> and the first and second, second delay control codes CON_2<1> and CON_2<2> are enabled among the second delay control codes CON_2<1>, CON_2<2>, ..., CON_2<N> while the first to third, input delay control codes CON_PUB<1>, CON_PUB<2> and CON_PUB<3> are enabled among the input delay control codes CON_PUB<1>, CON_PUB<2>, ..., CON_PUB<N>, the first and second input delay units 300<1> and 300<2> among the input delay units 300<1>, 300<2>, ..., 300<N> included in the input delay circuit 300 belong to the common delay path, and the third input delay unit 300<3> belongs to the additional delay path. Therefore, the first output delay circuit 320 receives an input signal IN_SIG_2 which is delayed and outputted in two steps (each step for delaying by a delay unit) through the common delay path of the input delay circuit 300 and performs a delay operation. The second output delay circuit 340 receives an input signal IN_SIG_3 which is delayed and outputted in three steps (each step for delaying by a delay unit) through both common delay path and the additional delay path and performs a delay operation.

The fourth to $N^{th}$ input delay units 300<4>, 300<5>, ..., 300<N> which do not belong to any of the common delay path and the additional delay path in the input delay circuit 300 do not perform a delay operation. Therefore, an output signal is an insignificant signal whose level is set with no regard to the input signal IN_SIG_S transferred through the signal input node IN_SIG_ND. The signals transferred from the input delay circuit 300 are usually set to a logic low level.

When an operation of the common delay path of the input delay circuit 300 is initialized, the length is set to 0 (that is, does not delay the input signal IN_SIG_S and outputs as it is) in correspondence to the initial value (which is the state where all of the input delay control codes are disabled) of the input delay control codes CON_PUB<1>, CON_PUB<2>, ..., CON_PUB<N>; and the delay of the input signal is increased by a length corresponding to a delay unit in correspondence to the value of the input delay control codes CON_PUB<1>, CON_PUB<2>, . . . , CON_PUB<N> increasing by one unit.

Also, an operation of the additional delay path of the input delay circuit 300 will be explained hereafter. When the values of the input delay control codes CON_PUB<1>, CON_PUB<2>, . . . , CON_PUB<N> have the same values as the first delay control codes CON_1<1>, CON_1<2>, . . . , CON_1<N> and have values greater than the second delay control codes CON_2<1>, CON_2<2>, . . . , CON_2<N> by one unit, the length is set to '0' (that is, an input signal is outputted from the common delay path without any delay). When the values of the input delay control codes CON_PUB<1>, CON_PUB<2>, . . . , CON_PUB<N> are one unit greater than the values of the first delay control codes CON_1<1>, CON_1<2>, . . . , CON_1<N> and the second delay control codes CON_2<1>, CON_2<2>, . . . , CON_2<N>, the length is set corresponding to a delay unit.

Hereafter, an operation of the first output delay circuit 320 will be described. When the first delay control codes CON_1<1>, CON_1<2>, . . . , CON_1<N> are enabled, the plurality of the first output delay units 320<1>, 320<2>, . . . , 320<N> included in the first output delay circuit 320 receive the output signals OUT_SIG1_1, OUT_SIG1_2, . . . , OUT_SIG1_N transferred from the preceding first output delay units 320<2>, 320<3>, . . . , 320<N> among the first output delay units 320<1>, 320<2>, . . . , 320<N−1>, delay the output signals OUT_SIG1_1, OUT_SIG1_2, . . . , OUT_SIG1_N for a delay unit, and outputs delayed signals, respectively. When the first delay control codes CON_1<1>, CON_1<2>, . . . , CON_1<N> are disabled, the plurality of the first output delay units 320<1>, 320<2>, . . . , 320<N> included in the first output delay circuit 320 receive the input signal IN_SIG_S transferred from the signal input node IN_SIG_ND or the input signals IN_SIG_1, IN_SIG_2, . . . , IN_SIG_N−1 transferred from the plurality of the input delay units 300<1>, 300<2>, . . . , 300<N−1> included in the input delay circuit 300, delay them for a delay unit, and output delayed signals, respectively.

To sum up, a determination of which of the two signals the first output delay units 320<1>, 320<2>, . . . , 320<N> will receive depends on whether the first delay control codes CON_1<1>, CON_1<2>, . . . , CON_1<N> are enabled or disabled. Therefore, when any one bit among the multi-bit first delay control codes CON_1<1>, CON_1<2>, . . . , CON_1<N> is selectively enabled as the highest enabled bit, bits of units lower than the highest enabled bit are all enabled while bits of unit higher than the highest enabled bit are all disabled.

For example, when it is assumed that the third, first delay control code CON_1<3> among the first delay control codes CON_1<1>, CON_1<2>, . . . , CON_1<N> is selectively enabled as the highest enabled bit, the first and second first delay control codes CON_1<1> and CON_1<2>, which are of units lower than the highest enabled third, first delay control code CON_1<3>, are enabled while the fourth to N$^{th}$ first delay control codes CON_1<4>, CON_1<5>, . . . , CON_1<N>, which are of units higher than the highest enabled third, first delay control code CON_1<3>, are disabled.

As shown in the above-described example, when the first to third first delay control codes CON_1<1>, CON_1<2> and CON_1<3> among the first delay control codes CON_1<1>, CON_1<2>, . . . , CON_1<N> are enabled and the remaining fourth to N$^{th}$ first delay control codes CON_1<4>, CON_1<5>, . . . , CON_1<N> are disabled, the first output delay circuit 320 performs an operation of receiving an input signal IN_SIG_3 transferred through the third input delay unit 300<3>, delaying the received input signal IN_SIG_3 on the basis of a delay unit, and outputting a delayed signal. Also, the first to third, first output delay units 320<1>, 320<2> and 320<3> among the plurality of the first output delay units 320<1>, 320<2>, . . . , 320<N> included in the first output delay circuit 320 respectively perform an operation of receiving output signals OUT_SIG1_1, OUT_SIG1_2 and OUT_SIG1_3 of the second to fourth first output delay units 320<2>, 320<3> and 320<4>, which are the preceding first output delay units, delaying the received signals OUT_SIG1_1, OUT_SIG1_2 and OUT_SIG1_3 by a delay unit, and outputting delayed signals OUT_SIG1_S, OUT_SIG1_1 and OUT_SIG1_2.

To be specific, among the plurality of the first output delay units 320<1>, 320<2>, . . . , 320<N> included in the first output delay circuit 320, the input signal IN_SIG_3 that has passed through the input delay circuit 300 and been transferred to the fourth, first output delay unit 320<4> is delayed in four steps (each step for delaying by a delay unit) as it passes through the fourth to first, first output delay units 320<4>, 320<3>, 320<2> and 320<1> to thereby output signals OUT_SIG1_3, OUT_SIG1_2, OUT_SIG1_1 and OUT_SIG1_F. Therefore, the first delay path of the first output delay circuit 320 has a length corresponding to the four delay units.

On the other hand, although the fifth to N$^{th}$ first output delay units 320<5>, 320<6>, . . . , 320<N> receive the first delay control codes CON_1<5>, CON_1<6>, . . . , CON_1<N> corresponding thereto through the input delay circuit 300, the signals transferred from the input delay circuit 300 are insignificant signals whose level is set with no regard to the input signal IN_SIG_S transferred through the signal input node IN_SIG_ND. Therefore, the output signals are insignificant signals whose level is set with no regard to the input signal IN_SIG_S transferred through the signal input node IN_SIG_ND. The signals transferred from the input delay circuit 300 are usually set to a logic low level.

When the operation of the first output delay circuit 320 for determining the length of a first delay path is initialized, the first output delay circuit 320 delays the input signal IN_SIG_S (a case where the length of the input delay circuit 300 is '0') transferred from the input delay circuit 300 for a delay unit in response to the initial value (which signifies a state where all the first delay control codes are disabled) of the first delay control codes CON_1<1>, CON_1<2>, . . . , CON_1<N>. The first output delay circuit 320 increases the input signals IN_SIG_1, IN_SIG_2, . . . , IN_SIG_N−1 transferred from the input delay circuit 300 for a delay unit in response to a one-unit increase of the values of the first delay control codes CON_1<1>, CON_1<2>, . . . , CON_1<N>.

Herein, it may be seen from the above that the first output delay circuit 320 directly receives the input signal IN_SIG_S transferred through the signal input node IN_SIG_ND in the state of the initial value where all the first delay control codes CON_1<1>, CON_1<2>, . . . , CON_1<N> are disabled. During the initialization, the length of the common delay path becomes '0' and the input signal IN_SIG_S is outputted without any delay in the state of the initial value where all the common delay control codes CON_PUB<1>, CON_PUB<2>, . . . , CON_PUB<N> are disabled, which is used in the description of generalizing the operation of the input delay circuit 300.

Hereafter, an operation of the second output delay circuit 340 will be described. The plurality of the second output delay units 340<1>, 340<2>, . . . , 340<N> included in the second output delay circuit 340 receive the output signals OUT_SIG1_1, OUT_SIG1_2, . . . , OUT_SIG1_N transferred from the preceding second output delay units 340<2>, 340<3>, . . . , 340<N> among the second output delay units 340<1>, 340<2>, 340<3>, . . . , 340<N−1>, when the second delay control codes CON_2<1>, CON_2<2>, . . . , CON_2<N> are enabled, delay the received output signals OUT_SIG1_1, OUT_SIG1_2, . . . , OUT_SIG1_N on the basis of a delay unit, and output delayed signals. Also, when the second delay control codes CON_2<1>, CON_2<2>, . . . , CON_2<N> are disabled, the second output delay circuit 340 delays the input signals IN_SIG_1, IN_SIG_2, . . . , IN_SIG_N transferred from the plurality of the input delay units 300<1>, 300<2>, . . . , 300<N> included in the input delay circuit 300, delays them for a delay unit, and outputs delayed signals, respectively.

To be specific, a determination of which of two signals that the plurality of the second output delay units 340<1>, 340<2>, . . . , 340<N> will receive depends on whether the second delay control codes CON_2<1>, CON_2<2>, . . . , CON_2<N> are enabled or disabled. Therefore, when any one bit among the multi-bit second delay control codes CON_2<1>, CON_2<2>, . . . , CON_2<N> is selectively enabled as the highest enabled bit, bits of units lower than the highest enabled bit are all enabled while bits of units higher than the highest enabled bit are all disabled.

For example, when it is assumed that the third second delay control code CON_2<3> among the second delay control codes CON_2<1>, CON_2<2>, . . . , CON_2<N> is enabled, the first and second, second delay control codes CON_2<1> and CON_2<2>, which are of units lower than the highest enabled code, are enabled while the fourth to $N^{th}$ second delay control codes CON_2<4>, CON_2<5>, . . . , CON_2<N>, which are of units higher than the highest enabled code, are disabled.

As described in the above example, when the first to third, second delay control codes CON_2<1>, CON_2<2> and CON_2<3> among the second delay control codes CON_2<1>, CON_2<2>, . . . , CON_2<N> are enabled and the remaining fourth to $N^{th}$ second delay control codes CON_2<4>, CON_2<5>, . . . , CON_2<N> are disabled, the second output delay circuit 340 receives the input signal IN_SIG_4 transferred through the fourth input delay unit 300<4>, delays the received input signal IN_SIG_4 for a delay unit, and outputs a delayed signal. Meanwhile, the first to third, second output delay units 340<1>, 340<2> and 340<3> among the plurality of the second output delay units 340<1>, 340<2>, . . . , 340<N> included in the second output delay circuit 340 delay the output signals OUT_SIG1_1, OUT_SIG1_2 and OUT_SIG1_3 transferred from the preceding second to fourth second output delay units 340<2>, 340<3> and 340<4> for a delay unit and output delayed signals OUT_SIG1_S, OUT_SIG1_1 and OUT_SIG_2.

In other words, the input signal IN_SIG_4 transferred to the fourth, first output delay unit 340<4> through the input delay circuit 300 among the plurality of the second output delay units 340<1>, 340<2>, 340<3>, . . . , 340<N> included in the second output delay circuit 340 is delayed in four steps (each step for delaying by a delay unit) through the fourth to first second output delay units 340<4>, 340<3>, 340<2> and 340<1>, and then outputted as output signals OUT_SIG1_3, OUT_SIG1_2, OUT_SIG1_1 and OUT_SIG1_F. Therefore, the second delay path in the second output delay circuit 340 has a length corresponding to four delay units.

On the other hand, although the fifth to $N^{th}$ second delay units 340<5>, 340<6>, . . . , 340<N> receive corresponding second delay control codes CON_2<5>, CON_2<6>, . . . , CON_2<N> through the input delay circuit 300, the signals transferred from the input delay circuit 300 are insignificant signals whose level is set with no regard to the input signal IN_SIG_S transferred through the signal input node IN_SIG_ND. Therefore, the output signals are insignificant signals whose level is set with no regard to the input signal IN_SIG_S transferred through the signal input node IN_SIG_ND as well. The level of the signals transferred from the input delay circuit 300 is usually set to a logic low level.

When the operation of the second output delay circuit 340 for determining the length of the second delay length is initialized, the second output delay circuit 340 delays the input signal IN_SIG_1 (which is a case where the length of the common delay path of the input delay circuit 300 is '0' and the length of the additional delay path correspond to one delay unit) transferred from the input delay circuit 300 for two delay units in response to the initial value (which is a case where all the second delay control codes are disabled) of the second delay control codes CON_2<1>, CON_2<2>, . . . , CON_2<N>, and the second output delay circuit 340 increases the input signals IN_SIG_1, IN_SIG_2, and IN_SIG_N−1 transferred from the input delay circuit 300 for a delay unit in response to a one-unit increase (which signifies that the highest enabled bit of the second delay control codes CON_2<1>, CON_2<2>, . . . , CON_2<N> is sequentially increased) of the values of the second delay control codes CON_2<1>, CON_2<2>, . . . , CON_2<N>.

When the input delay circuit 300, the first output delay circuit 320, and the second output delay circuit 340 operate, the relationship between the finally outputted signals will be described hereafter based on what is described above.

First, in a case where the values of the input delay control codes CON_PUB<1>, CON_PUB<2>, . . . , CON_PUB<N> for determining the length of the input delay circuit 300 are one unit higher than the values of the first delay control codes CON_1<1>, CON_1<2>, . . . , CON_1<N> for determining the length of the first output delay circuit 320 and the values of the second delay control codes CON_2<1>, CON_2<2>, . . . , CON_2<N> for determining the length of the second output delay circuit 340, according to an example, the input delay circuit 300 includes the common delay path having a length of two delay units and an additional delay path having a length of one delay unit when the input delay circuit 300 has a length of three delay units.

Also, since the input delay circuit 300 has a length of three delay units, the first output delay circuit 320 and the second output delay circuit 340 come to have a length of three delay units as well.

In this circumstance, the output signal OUT_SIG1_F outputted from the first output delay circuit 320 is a signal outputted after being delayed by two delay units, which corresponds to the length of the common delay path of the input delay circuit 300, and delayed again by three delay units, which corresponds to the length of the first delay path of the first output delay circuit 320. Therefore, the output signal OUT_SIG1_F is a signal delayed obtained from delaying the input signal IN_SIG_S applied to the input delay circuit 300 through the signal input node IN_SIG_ND by a total of five delay units.

On the other hand, the output signal OUT_SIG2_F outputted from the second output delay circuit 340 is a signal outputted after being delayed by three delay units, which corresponds to the length of the common delay path and the additional delay path of the input delay circuit 300, and delayed again by three delay units, which corresponds to the length of the second delay path of the second output delay circuit 340. Therefore, the output signal OUT_SIG2_F is a signal delayed by a total of six delay units, compared with the input signal IN_SIG_S applied to the input delay circuit 300 through the signal input node IN_SIG_ND.

Secondly, when it is assumed that the values of the input delay control codes CON_PUB<1>, CON_PUB<2>, ..., CON_PUB<N> for determining the length of the input delay circuit 300 are the same as the values of the first delay control codes CON_1<1>, CON_1<2>, ..., CON_1<N> for determining the length of the first output delay circuit 320 and one unit higher than the values of the second delay control codes CON_2<1>, CON_2<2>, ..., CON_2<N> for determining the length of the second output delay circuit 340, it can be understood that the input delay circuit 300 includes only the common delay path having a length of three delay units and there is no additional delay path when the input delay circuit 300 has a length of three delay units.

Also, since the input delay circuit 300 has a length of three delay units, the first output delay circuit 320 has a length of four delay units, and the second output delay circuit 340 has a length of three delay units.

In this circumstance, the output signal OUT_SIG1_F outputted from the first output delay circuit 320 is a signal outputted after being delayed by three delay units, which corresponds to the length of the common delay path of the input delay circuit 300, and delayed again by four delay units, which corresponds to the length of the first delay path of the first output delay circuit 320. Therefore, the output signal OUT_SIG1_F is a signal obtained by delaying the input signal IN_SIG_S applied to the input delay circuit 300 through the signal input node IN_SIG_ND by a total of seven delay units.

On the other hand, the output signal OUT_SIG2_F outputted from the second output delay circuit 340 is a signal outputted after being delayed by three delay units, which corresponds to the length of the common delay path and the additional delay path of the input delay circuit 300, and delayed again by three delay units, which corresponds to the length of the second delay path of the second output delay circuit 340. Therefore, the output signal OUT_SIG2_F is a signal by delaying the input signal IN_SIG_S applied to the input delay circuit 300 through the signal input node IN_SIG_ND for a total of six delay units.

Like the conventional technology, the phase mixer 260 mixes the phase of the final output signal OUT_SIG1_F of the first output delay circuit 320 and the phase of the final output signal OUT_SIG2_F of the second output delay circuit 340 and is able to generate an output signal OUT_SIG_F having a delay amount smaller than one delay unit, when the final output signal OUT_SIG1_F of the first output delay circuit 320 and the final output signal OUT_SIG2_F of the second output delay circuit 340 have a difference of one delay unit.

According to the second embodiment of the present invention described above, the input signal IN_SIG_S transferred through the signal input node IN_SIG_ND of delay lines is first delayed by a delay amount set in the input delay circuit 300, and then delayed again by predetermined delay amounts while passing through the first output delay circuit 320 and the second output delay circuit 340 to be thereby outputted as two output signals OUT_SIG1_F and OUT_SIG2_F through two output nodes OUT_SIG_ND1 and OUT_SIG_ND2.

Therefore, when the input signal IN_SIG_S is transferred to the signal input node IN_SIG_ND through the input driver 380, it is dependent on the loads of the input delay circuit 300. Thus, it is possible not only to minimize/reduce the level change of the input signal IN_SIG_S but also to minimize/reduce the size of the input driver 380. As a result, the input signal IN_SIG_S can pass through the delay lines with a high accuracy and quicker response.

Therefore, the delay lines according to the second embodiment of the present invention can be applied to a semiconductor device operating faster than conventional semiconductor devices.

3$^{RD}$ Embodiment

Figure 4:
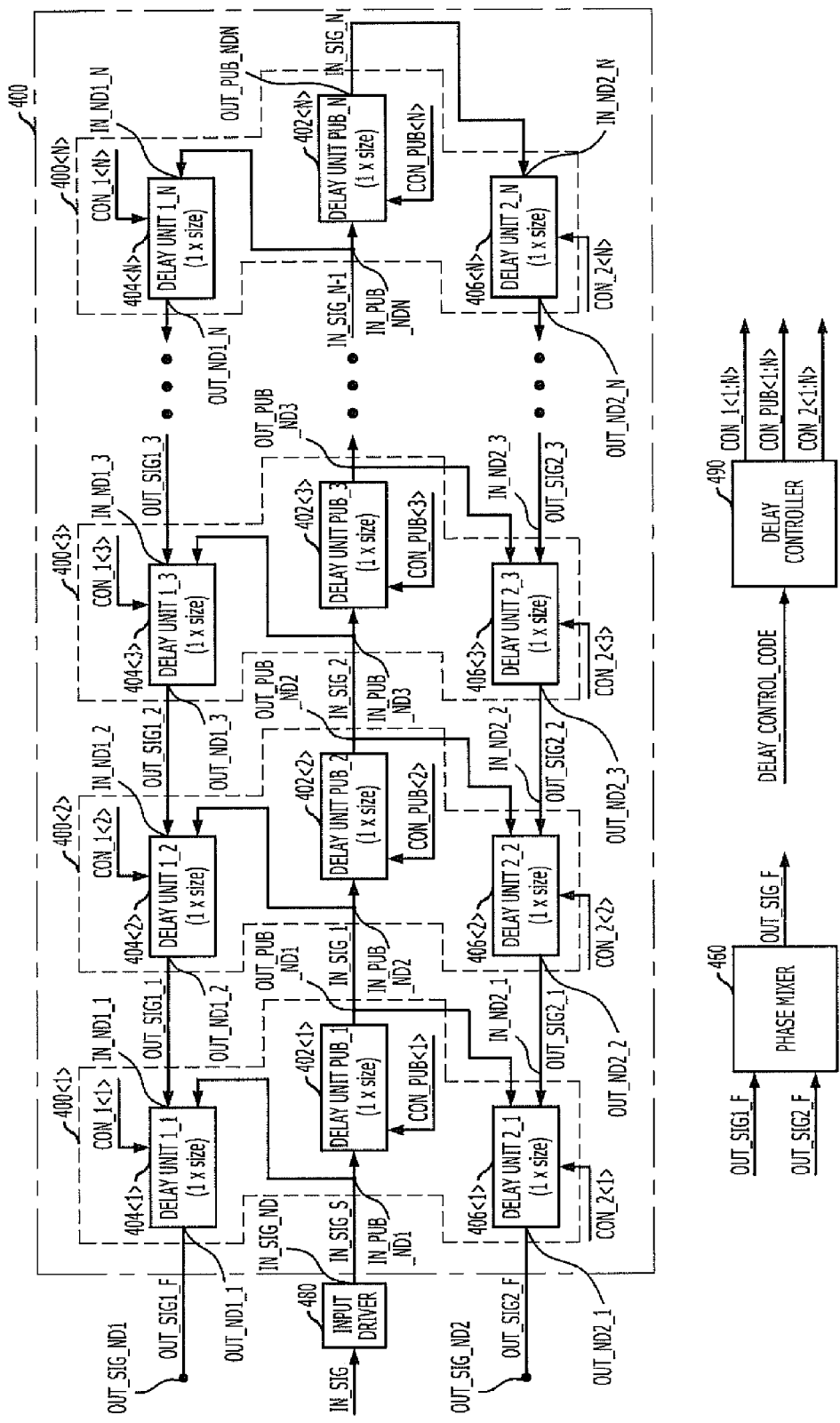
FIG. 4 is a block diagram illustrating a semiconductor device having delay lines in accordance with a third embodiment of the present invention.

FIG. 4 is a block diagram illustrating a semiconductor device having delay lines in accordance with a third embodiment of the present invention.

Referring to FIG. 4, the semiconductor device having delay lines 400, which are formed of a plurality of series-coupled unit delay blocks 400<1>, 400<2>, ..., 400<N>. The plurality of series-coupled unit delay blocks 400<1>, 400<2>, ..., 400<N> include common delay circuits 402<1>, 402<2>, ..., 402<N>, first delay circuits 404<1>, 404<2>, ..., 404<N>, and second delay circuits 406<1>, 406<2>, ..., 406<N>. The unit delay blocks 400<1>, 400<2>, ..., 400<N> delay input signals inputted to common input nodes IN_PUB_ND1, IN_PUB_ND2, ..., IN_PUB_NDN in response to delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N> and output delayed signals to common output nodes OUT_PUB_ND1, OUT_PUB_ND2, ..., OUT_PUB_NDN. The first delay circuits 404<1>, 404<2>, ..., 404<N> delay input signals IN_SIG_S, IN_SIG_1, IN_SIG_2, ..., IN_SIG_N−1 or OUT_SIG1_1, OUT_SIG1_2, ..., OUT_SIG1_N inputted to any one input node between the common input nodes IN_PUB_ND1, IN_PUB_ND2, ..., IN_PUB_NDN and first input nodes IN_ND1_1, IN_ND1_2, ..., IN_ND1_N, and output delayed signals to first output nodes OUT_ND1_1, OUT_ND1_2, ..., OUT_ND1_N in response to the delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N>. The second delay circuits 406<1>, 406<2>, ..., 406<N> delay input signals IN_SIG_1, IN_SIG_2, ..., IN_SIG_N or OUT_SIG2_1, OUT_SIG2_2, ..., OUT_SIG2_N inputted to any one input node between the common output nodes OUT_PUB_ND1, OUT_PUB_ND2, ..., OUT_PUB_NDN and second input nodes IN_ND2_1, IN_ND2_2, ..., IN_ND2_N, and output delayed signals to second output nodes OUT_ND2_1, OUT_ND2_2, ..., OUT_ND2_N in response to the delay control codes CON_PUB<1>, CON_PUB<2>, ..., CON_PUB<N>, CON_1<1>, CON_1<2>, ..., CON_1<N>, CON_2<1>, CON_2<2>, ..., CON_2<N>. Also, the unit delay blocks 400<1>, 400<2>, ..., 400<N> further include a phase mixer 460 for mixing the phase of an output signal OUT_SIG1_F outputted through a first signal output node OUT_SIG_ND1 with the phase of an output signal OUT_SIG2_F outputted through a second signal output node OUT_SIG_ND2.

When a corresponding unit delay block is the unit delay block 400<1> positioned at the beginning of the delay lines among the unit delay blocks 400<1>, 400<2>, ..., 400<N>, the common input node IN_PUB_ND1 of the unit delay block 400<1> is coupled with the input signal node IN_SIG_ND of the delay lines 400, and the first output node OUT_ND1_1 of the unit delay block 400<1> is coupled with the first signal output node OUT_SIG_ND1 of the delay lines 400, while the second output node OUT_ND2_1 of the unit delay block 400<1> is coupled with the second signal output node OUT_SIG_ND2 of the delay lines 400.

Also, when a corresponding unit delay block is not the unit delay block 400<1> positioned at the beginning of the delay lines among the unit delay blocks 400<1>, 400<2>, . . . , 400<N> having the above-described structure, the common input nodes IN_PUB_ND1, IN_PUB_ND2, . . . , IN_PUB_NDN of the unit delay blocks 400<2>, 400<3>, . . . , 400<N> are coupled with the common output nodes OUT_PUB_ND1, OUT_PUB_ND2, OUT_PUB_NDN-1 of the preceding unit delay blocks 400<1>, 400<2>, . . . , 400<N-1>, and the first output nodes OUT_ND1_2, OUT_ND1_3, . . . , OUT_ND1_N of the unit delay blocks 400<2>, 400<3>, . . . , 400<N> are coupled with the first input nodes IN_ND1_1, IN_ND1_2, . . . , IN_ND1_N-1 of the preceding unit delay blocks 400<1>, 400<2>, . . . , 400<N-1>, and the second output nodes OUT_ND2_1, OUT_ND2_2, . . . , OUT_ND2_N of the unit delay blocks 400<2>, 400<3>, . . . , 400<N> are coupled with the second input nodes IN_ND2_1, IN_ND2_2, . . . , IN_ND2_N-1 of the preceding unit delay blocks 400<1>, 400<2>, . . . , 400<N-1>.

When a corresponding unit delay block is the unit delay block 400<N> positioned at the end of the delay lines 400 among the unit delay blocks 400<1>, 400<2>, . . . , 400<N> having the above-described structure, the common output node OUT_PUB_NDN of the unit delay block 400<N> is coupled with the second input node IN_ND2_N of the unit delay block 400<N>, and the first input node IN_ND1_N of the unit delay block 400<N> is coupled with the common input node IN_PUB_NDN of the unit delay block 400<N>, while the second input node IN_ND2_N of the unit delay block 400<N> is coupled with the common output node OUT_PUB_NDN of the unit delay block 400<N>.

Also, when a corresponding unit delay block is not the unit delay block 400<N> positioned at the end of the delay lines 400 among the unit delay blocks 400<1>, 400<2>, . . . , 400<N> having the above structure, the common output nodes OUT_PUB_ND1, OUT_PUB_ND2, . . . , OUT_PUB_NDN-1 of the unit delay blocks 400<1>, 400<2>, . . . , 400<N-1> are coupled with the common input nodes IN_PUB_ND2, IN_PUB_ND3, . . . , IN_PUB_NDN of the subsequent unit delay blocks 400<2>, 400<3>; . . . , 400<N>, and the first input nodes IN_ND1_1, IN_ND1_2, . . . , IN_ND1_N-1 of the unit delay blocks 400<1>, 400<2>, . . . , 400<N-1> are coupled with the first output nodes OUT_ND1_1, OUT_ND1_2, . . . , OUT_ND1_N of the subsequent unit delay blocks 400<2>, 400<3>, . . . , 400<N>, while the second input nodes IN_ND2_1, IN_ND2_2, . . . ; IN_ND2_N-1 of the unit delay blocks 400<1>, 400<2>, . . . , 400<N-1> are coupled with the second output nodes OUT_ND2_2, OUT_ND2_3, . . . , OUT_ND2_N of the rear unit delay blocks 400<2>, 400<3>, . . . , 400<N>.

The delay control codes CON_PUB<1>, CON_PUB<2>, . . . , CON_PUB<N>, CON_1<1>, CON_1<2>, . . . , CON_1<N>, CON_2<1>, CON_2<2>, . . . , CON_2<N> are generated in a delay controller 590, and they include common delay control codes delay control codes CON_PUB<1>, CON_PUB<2>, . . . , CON_PUB<N> for controlling the operation of the common delay circuits 402<1>, 402<2>, . . . , 402<N>, first delay control codes CON_1<1>, CON_1<2>, . . . , CON_1<N> for controlling the operation of the first delay circuits 404<1>, 404<2>, . . . , 404<N>, second delay control codes CON_2<1>, CON_2<2>, . . . , CON_2<N> for controlling the operation of the second delay circuits 406<1>, 406<2>, . . . , 406<N>.

Herein, the common delay circuits 402<1>, 402<2>, . . . , 402<N> included in the unit delay blocks 400<1>, 400<2>, . . . , 400<N> delay input signals IN_SIG_S, IN_SIG_1, IN_SIG_2, . . . , IN_SIG_N-1 inputted to the common input nodes IN_PUB_ND1, IN_PUB_ND2, . . . , IN_PUB_NDN for a delay unit and output delayed signals IN_SIG_1, IN_SIG_2, . . . , IN_SIG_N to the common output nodes OUT_PUB_ND1, OUT_PUB_ND2, . . . , OUT_PUB_NDN in response to the enablement of the common delay control codes delay control codes CON_PUB<1>, CON_PUB<2>, . . . , CON_PUB<N>; and does not pass through the input signals IN_SIG_S, IN_SIG_1, IN_SIG_2, . . . , IN_SIG_N-1 inputted to the common input nodes IN_PUB_ND1, IN_PUB_ND2, . . . , IN_PUB_NDN in response to the disablement of the common delay control codes delay control codes CON_PUB<1>, CON_PUB<2>, . . . , CON_PUB<N>.

Also, the first delay circuits 404<1>, 404<2>, . . . , 404<N> included in the unit delay blocks 400<1>, 400<2>, . . . , 400<N> delay the input signals OUT_SIG_1, OUT_SIG_2, . . . , OUT_SIG_N inputted through the first input nodes IN_ND1_1, IN_ND1_2, . . . , IN_ND1_N for a delay unit and output delayed signals OUT_SIG1_F, OUT_SIG1_1, OUT_SIG1_2, . . . , OUT_SIG1_N-1 to the first output nodes OUT_ND1_1, OUT_ND1_2, . . . , OUT_ND1_N in response to the enablement of the first delay control codes CON_1<1>, CON_1<2>, . . . , CON_1<N>. The first delay circuits 404<1>, 404<2>, . . . , 404<N> included in the unit delay blocks 400<1>, 400<2>, . . . , 400<N> delay the input signals IN_SIG_1, IN_SIG_2, . . . , IN_SIG_N outputted from the common output nodes OUT_PUB_ND1, OUT_PUB_ND2, . . . , OUT_PUB_NDN for a delay unit and output delayed signals OUT_SIG2_F, OUT_SIG2_1, OUT_SIG2_2, . . . , OUT_SIG2_N-1 to the second output nodes OUT_ND2_1, OUT_ND2_2, . . . , OUT_ND2_N in response to the disablement of the second delay control codes CON_2<1>, CON_2<2>, . . . , CON_2<N>.

According to the third embodiment of the present invention described above, the input signal IN_SIG_S transferred through the signal input node IN_SIG_ND of the delay lines 400 is delayed for a predetermined delay amount while it passes through the common delay circuits 402<1>, 402<2>, . . . , 402<N> included in the plurality of the unit delay blocks 400<1>, 400<2>, . . . , 400<N>, and then delayed again by a predetermined delay amount while passing through the first delay circuits 404<1>, 404<2>, . . . , 404<N> and the second delay circuits 406<1>, 406<2>, . . . , 406<N> included in the plurality of the unit delay blocks 400<1>, 400<2>, . . . , 400<N> to be thereby outputted as two output signals OUT_SIG1_F and OUT_SIG2_F through two output nodes OUT_SIG_ND1 and OUT_SIG_ND2.

Therefore, when the input signal IN_SIG_S is transferred to the signal input node IN_SIG_ND through an input driver 480, it is dependent on the loads of the plurality of the unit delay blocks 400<1>, 400<2>, . . . , 400<N>. Thus, it is possible not only to minimize/reduce the level change of the input signal IN_SIG_S but also to minimize/reduce the size of the input driver 480. As a result, the input signal IN_SIG_S can pass through the delay lines with a high accuracy and fast response time.

Therefore, the delay lines according to the third embodiment of the present invention can be applied to a semiconductor device operating faster than conventional semiconductor devices.

$4^{TH}$ Embodiment

Figure 5:
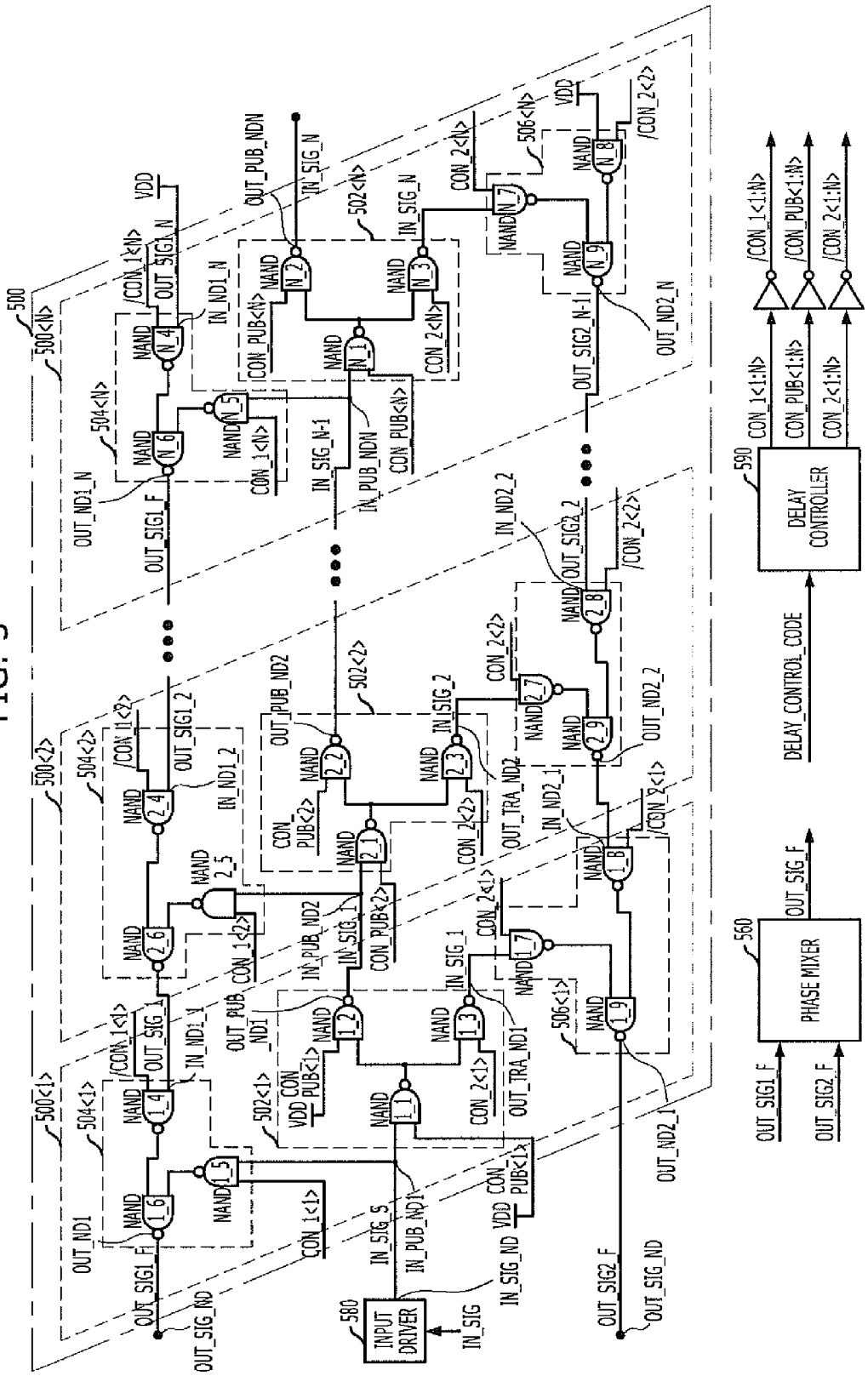
FIG. 5 is a block diagram illustrating a semiconductor device having delay lines in accordance with a fourth embodiment of the present invention.

FIG. 5 is a block diagram illustrating a semiconductor device having delay lines in accordance with a fourth embodiment of the present invention.

Referring to FIG. 5, the semiconductor device having delay lines 500, which are formed of a plurality of series-coupled unit delay blocks 500<1>, 500<2>, . . . , 500<N>. The plurality of series-coupled unit delay blocks 500<1>, 500<2>, ..., 500<N> include first delay logic blocks 502<1>, 502<2>, ..., 502<N>, second delay logic blocks 504<1>, 504<2>, ..., 504<N>, and third delay logic blocks 506<1>, 506<2>, ..., 506<N>. The first delay logic blocks 502<1>, 502<2>, ..., 502<N> receive input signals IN_SIG_S, IN_SIG_1, IN_SIG_2, ..., IN_SIG_N−1 carried on first signal input nodes IN_PUB_ND1, IN_PUB_ND2, ..., IN_PUB_NDN, delay the received input signals IN_SIG_S, IN_SIG_1, IN_SIG_2, ..., IN_SIG_N−1, and output delayed signals to first signal output nodes OUT_PUB_ND1, OUT_PUB_ND2, ..., OUT_PUB_NDN or signal transfer nodes OUT_TRA_ND1, OUT_TRA_ND2, ..., OUT_TRA_NDN in response to first delay control codes CON_PUB<1>, CON_PUB<2>, ..., CON_PUB<N>.

The second delay logic blocks 504<1>, 504<2>, ..., 504<N> receive the input signals IN_SIG_S, IN_SIG_1, IN_SIG_2, ..., IN_SIG_N−1 carried on the first signal input nodes IN_PUB_ND1, IN_PUB_ND2, ..., IN_PUB_NDN in response to second delay control codes CON_1<1>, CON_1<2>, ..., CON_1<N>, or receive output signals OUT_SIG1_1, OUT_SIG1_2, ..., OUT_SIG1_N carried on the second signal input nodes IN_ND1_1, IN_ND1_2, IN_ND1_N in response to inverted signals /CON_1<1>, /CON_1<2>, ..., /CON_1<N> of the second delay control codes. Subsequently, the second delay logic blocks 504<1>, 504<2>, ..., 504<N> delay the received signals OUT_SIG1_1, OUT_SIG1_2, OUT_SIG1_N and output delayed signals to the second signal output nodes OUT_ND1_1, OUT_ND1_2, ..., OUT_ND1_N.

The third delay logic blocks 506<1>, 506<2>, ..., 506<N> receive input signals IN_SIG_1, IN_SIG_2, IN_SIG_N−1 carried on the signal transfer nodes OUT_TRA_ND1, OUT_TRA_ND2, OUT_TRA_NDN in response to third delay control codes CON_2<1>, CON_2<2>, CON_2<N>, or receive signals OUT_SIG2_1, OUT_SIG2_2, OUT_SIG2_N carried on the third signal input nodes IN_ND2_1, IN_ND2_2, IN_ND2_N in response to the inverted signals of the inverted signals /CON_2<1>, /CON_2<2>, ..., /CON_2<N> of the third delay control codes. Subsequently, the third delay logic blocks 506<1>, 506<2>, ..., 506<N> delay the received signals OUT_SIG2_1, OUT_SIG2_2, ..., OUT_SIG2_N and output delayed signals to the third signal output nodes OUT_ND2_1, OUT_ND2_2, OUT_ND2_N. Also, the unit delay blocks 500<1>, 500<2>, ..., 500<N> further include a phase mixer 560 for mixing the phase of an output signal OUT_SIG1_F outputted through a first signal output node OUT_SIG_ND1 with the phase of an output signal OUT_SIG2_F outputted through a second signal output node OUT_SIG_ND2. Furthermore, the unit delay blocks 500<1>, 500<2>, ..., 500<N> include a delay controller 590 for generating first delay control codes CON_PUB<1>, CON_PUB<2>, ..., CON_PUB<N>, second delay control codes CON_1<1>, CON_1<2>, ..., CON_1<N>, and third delay control codes CON_2<1>, CON_2<2>, ..., CON_2<N>.

Herein, the first delay logic blocks 502<1>, 502<2>, ..., 502<N> may be designed to have different structures according to different design needs.

First, the first delay logic blocks 502<1>, 502<2>, ..., 502<N> shown in the drawing include first NAND gates NAND1_1, NAND2_1, ..., NANDN_1, second NAND gates NAND1_2, NAND2_2, ..., NANDN_2, and third NAND gates NAND1_3, NAND2_3, ..., NANDN_3. The first NAND gates NAND1_1, NAND2_1, ..., NANDN_1 perform a NAND operation onto the first delay control codes CON_PUB<1>, CON_PUB<2>, ..., CON_PUB<N> and the input signals IN_SIG_S, IN_SIG_1, IN_SIG_2, ..., IN_SIG_N−1 carried on the first signal input nodes IN_PUB_ND1, IN_PUB_ND2, ..., IN_PUB_NDN. The second NAND gates NAND1_2, NAND2_2, ..., NANDN_2 perform a NAND operation onto the output signals of the first NAND gates NAND1_1, NAND2_1, ..., NANDN_1 and the first delay control codes CON_PUB<1>, CON_PUB<2>, ..., CON_PUB<N>, and output NAND signals IN_SIG_1, IN_SIG_2, ..., IN_SIG_N to the first signal output nodes OUT_PUB_ND1, OUT_PUB_ND2, ..., OUT_PUB_NDN. The third NAND gates NAND1_3, NAND2_3, ..., NANDN_3 perform a NAND operation onto the output signals of the first NAND gates NAND1_1, NAND2_1, ..., NANDN_1 and the third delay control codes CON_2<1>, CON_2<2>, ..., CON_2<N> and output NAND signals IN_SIG_1, IN_SIG_2, ..., IN_SIG_N to the signal transfer nodes OUT_TRA_ND1, OUT_TRA_ND2, ..., OUT_TRA_NDN.

Although not shown in the drawing, when the number of control signals used internally is to be reduced, the structures of the first delay logic blocks 502<1>, 502<2>, ..., 502<N1> may be changed as follows, while still having the same constituent elements illustrated in the drawing.

The first delay logic blocks 502<1>, 502<2>, ..., 502<N>, which have a reduced number of control signals than those shown in the drawing, include the first NAND gates NAND1_1, NAND2_1, ..., NANDN_1, the second NAND gates NAND1_2, NAND2_2, ..., NANDN_2, and the third NAND gates NAND1_3, NAND2_3, ..., NANDN_3. Herein, the first NAND gates NAND1_1, NAND2_1, ..., NANDN_1 perform a NAND operation onto the first delay control codes CON_PUB<1>, CON_PUB<2>, ..., CON_PUB<N> and the signals carried on the first signal input nodes IN_PUB_ND1, IN_PUB_ND2, ..., IN_PUB_NDN. The second NAND gates NAND1_2, NAND2_2, ..., NANDN_2 perform a NAND operation onto the output signals of the first NAND gates NAND1_1, NAND2_1, ..., NANDN_1 and the signals carried on a power source voltage VDD node, and output NAND signals IN_SIG_1, IN_SIG_2, ..., IN_SIG_N to the first signal output nodes OUT_PUB_ND1, OUT_PUB_ND2, ..., OUT_PUB_NDN. The third NAND gates NAND1_3, NAND2_3, ..., NANDN_3 perform a NAND operation onto the output signals of the first NAND gates NAND1_1, NAND2_1, ..., NANDN_1 and the signals carried on the power source voltage (VDD) node and output NAND signals IN_SIG_1, IN_SIG_2, ..., IN_SIG_N to the signal transfer nodes OUT_TRA_ND1, OUT_TRA_ND2, OUT_TRA_NDN.

In other words, the first delay logic blocks 502<1>, 502<2>, 502<N> with a reduced number of control signals transfer signals carried on the power source voltage VDD node instead of control signals, thereby reducing the number of control signals used internally.

Although not directly illustrated in the drawing, the structure of the first delay logic blocks 502<1>, 502<2>, ..., 502<N> may be modified as follows not only to reduce the number of control signals but also to minimize/reduce the constituent elements of the first delay logic blocks 502<1>, 502<2>, ..., 502<N> as well.

The first delay logic blocks 502<1>, 502<2>, 502<N>, which have a reduced number of control signals and reduced constituent elements than those shown in the drawing, include the first NAND gates NAND1_1, NAND2_1, ..., NANDN_1, and the second NAND gates NAND1_2, NAND2_2, ..., NANDN_2. Herein, the first NAND gates NAND1_1, NAND2_1, ..., NANDN_1 perform a NAND operation onto the first delay control codes CON_PUB<1>, CON_PUB<2>, ..., CON_PUB<N> and the signals carried on the first signal input nodes IN_PUB_ND1, IN_PUB_ND2, ..., IN_PUB_NDN. The second NAND gates NAND1_2, NAND2_2, ..., NANDN_2 perform a NAND operation onto the output signals of the first NAND gates NAND1_1, NAND2_1, ..., NANDN_1 and the signals carried on a power source voltage VDD node, and output NAND signals IN_SIG_1, IN_SIG_2, ..., IN_SIG_N to both of the first signal output nodes OUT_PUB_ND1, OUT_PUB_ND2, ..., OUT_PUB_NDN and the signal transfer nodes OUT_TRA_ND1, OUT_TRA_ND2, ..., OUT_TRA_NDN.

In other words, the first delay logic blocks 502<1>, 502<2>, ..., 502<N> with a reduced number of control signals and reduced constituent elements may use a method of simultaneously performing the function of the third NAND gates NAND1_3, NAND2_3, ..., NANDN_3 in the second NAND gates NAND1_2, NAND2_2, ..., NANDN_2.

The second delay logic blocks 504<1>, 504<2>, ..., 504<N> include fourth NAND gates NAND1_4, NAND2_4, ..., NANDN_4, fifth NAND gates NAND1_5, NAND2_5, ..., NANDN_5, and sixth NAND gates NAND1_6, NAND2_6, ..., NANDN_6. The fourth NAND gates NAND1_4, NAND2_4, ..., NANDN_4 perform a NAND operation onto the second delay control codes CON_1<1>, CON_1<2>, ..., CON_1<N> and the signals IN_SIG_S, IN_SIG_1, IN_SIG_2, ..., IN_SIG_N-1 carried on the first signal input nodes IN_PUB_ND1, IN_PUB_ND2, ..., IN_PUB_NDN. The fifth NAND gates NAND1_5, NAND2_5, ..., NANDN_5 perform a NAND operation onto the inverted signals /CON_1<1>, ..., /CON_1<2>, ..., /CON_1<N> of the second delay control codes and the signals OUT_SIG1_1, OUT_SIG1_2, ..., OUT_SIG1_N carried on the second signal input nodes IN_ND1_1, IN_ND1_2, ..., IN_ND1_N. The sixth NAND gates NAND1_6, NAND2_6, ..., NANDN_6 perform a NAND operation onto the output signals of the fourth NAND gates NAND1_4, NAND2_4, ..., NANDN_4 and the output signals of the fifth NAND gates NAND1_5, NAND2_5, ..., NANDN_5 and output NAND signals OUT_SIG1_F, OUT_SIG1_1, OUT_SIG1_2, ..., OUT_SIG1_N-1 to the second signal output nodes OUT_ND1_1, OUT_ND1_2, ..., OUT_ND1_N.

The third delay logic blocks 506<1>, 506<2>, ..., 506<N> include seventh NAND gates NAND1_7, NAND2_7, ..., NANDN_7, eighth NAND gates NAND1_8, NAND2_8, ..., NANDN_8, and ninth NAND gates NAND1_9, NAND2_9, ..., NANDN_9. The seventh NAND gates NAND1_7, NAND2_7, ..., NANDN_7 perform a NAND operation onto the third delay control codes CON_2<1>, CON_2<2>, ..., CON_2<N> and the signals IN_SIG_S, IN_SIG_1, IN_SIG_2, ..., IN_SIG_N carried on the signal transfer nodes OUT_TRA_ND1, OUT_TRA_ND2, ..., OUT_TRA_NDN. The eighth NAND gates NAND1_8, NAND2_8, ..., NANDN_8 perform a NAND operation onto the inverted signals /CON_2<1>, /CON_2<2>, ..., /CON_2<N> of the third delay control codes and the signals OUT_SIG2_1, OUT_SIG2_2, ..., OUT_SIG2_N carried on the third signal input nodes IN_ND2_1, IN_ND2_2, ..., IN_ND2_N. The ninth NAND gates NAND1_9, NAND2_9, ..., NANDN_9 perform a NAND operation onto the output signals of the seventh NAND gates NAND1_7, NAND2_7, ..., NANDN_7 and the output signals of the eighth NAND gates NAND1_8, NAND2_8, ..., NANDN_8 and output signals OUT_SIG2_F, OUT_SIG2_1, OUT_SIG2_2, ..., OUT_SIG2_N-1 to the third signal input nodes IN_ND2_1, IN_ND2_2, ..., IN_ND2_N.

In the above description, one NAND gate delays an input signal by ½ delay unit.

Therefore, it can be seen that the signals IN_SIG_S, ..., IN_SIG_1, IN_SIG_2, ..., IN_SIG_N-1 inputted to the first signal input nodes IN_PUB_ND1, IN_PUB_ND2, ..., IN_PUB_NDN of the unit delay blocks 500<1>, 500<2>, ..., 500<N> are delayed by one delay unit until they are transferred to the first signal output nodes OUT_PUB_ND1, OUT_PUB_ND2, ..., OUT_PUB_NDN or the signal transfer nodes OUT_TRA_ND1, OUT_TRA_ND2, ..., OUT_TRA_NDN.

Similarly, it can be seen that the signals OUT_SIG1_1, OUT_SIG1_2, ..., OUT_SIG1_N inputted to the second signal input nodes IN_ND1_1, IN_ND1_2, ..., IN_ND1_N of the unit delay blocks 500<1>, 500<2>, ..., 500<N> or the signals IN_SIG_1, IN_SIG_2, ..., IN_SIG_N carried on the first signal output nodes OUT_PUB_ND1, OUT_PUB_ND2, ..., OUT_PUB_NDN are delayed by one delay unit until they are transferred to the second signal output nodes OUT_ND1_1, OUT_ND1_2, ..., OUT_ND1_N.

Also, it can be seen that the signals OUT_SIG2_1, OUT_SIG2_2, ..., OUT_SIG2_N inputted to the third signal input nodes IN_ND2_1, IN_ND2_2, ..., IN_ND2_N of the unit delay blocks 500<1>, 500<2>, ..., 500<N> or the signals IN_SIG_S, IN_SIG_1, IN_SIG_2, ..., IN_SIG_N carried on the signal transfer nodes OUT_TRA_ND1, OUT_TRA_ND2, ..., OUT_TRA_NDN are delayed by one delay unit until they are transferred to the third signal output nodes OUT_ND2_1, OUT_ND2_2, ..., OUT_ND2_N.

In case of a unit delay block 500<1> at the beginning of the delay lines 500 among the unit delay blocks 500<1>, 500<2>, ..., 500<N> having the above-described structure, the first signal input node IN_PUB_ND1 of the unit delay block 500<1> corresponding thereto is coupled with the common signal input node IN_SIG_ND of the delay lines 500, and the second signal input node IN_ND1_1 of the unit delay block 500<1> is coupled with the first signal output node OUT_SIG_ND1 of the delay lines 500, while the third signal output node OUT_ND2_1 of the unit delay block 500<1> corresponding thereto is coupled with the second signal output node OUT_SIG_ND2 of the delay lines 500.

Conversely, when a corresponding unit delay block among the unit delay blocks 500<1>, 500<2>, ..., 500<N> having the above-described structure is not the beginning unit delay block 500<1> of the delay lines 500, the first signal input nodes IN_PUB_ND2, IN_PUB_ND3, ..., IN_PUB_NDN of the corresponding unit delay blocks 500<2>, 500<3>, ..., 500<N> are coupled with the first signal output nodes OUT_PUB_ND1, OUT_PUB_ND2, ..., OUT_PUB_NDN-1 of the front unit delay blocks 500<1>, 500<2>, ..., 500<N-1>, and the second signal output nodes OUT_ND1_2, OUT_ND1_3, ..., OUT ..., ND1_N of the corresponding unit delay blocks 500<2>, 500<3>, ..., 500<N> are coupled with the second signal input nodes IN_ND1_1, IN_ND1_2, ..., IN_ND1_N-1 of the front unit delay blocks 500<1>, 500<2>, ..., 500<N-1>, while the third signal output nodes OUT_ND2_2, OUT_ND2_3, ..., OUT_ND2_N of the corresponding unit delay blocks 500<2>, 500<3>, ..., 500<N> are coupled with the third signal input nodes IN_ND2_1, IN_ND2_2, ..., IN_ND2_N-1 of the beginning unit delay blocks 500<1>, 500<2>, ..., 500<N-1>.

when a corresponding unit delay block among the unit delay blocks 500<1>, 500<2>, ..., 500<N> having the above-described structure is the end unit delay block 500<N> of the delay lines 500, the second signal input node IN_ND1_N and the third signal input node IN_ND2_N of the unit delay block 500<N> are coupled with the power source voltage VDD node.

Conversely, when a corresponding unit delay block among the unit delay blocks 500<1>, 500<2>, . . . , 500<N> having the above-described structure is not the end unit delay block 500<N> of the delay lines 500, the first signal output nodes OUT_PUB_ND1, OUT_PUB_ND2, . . . , OUT_PUB_NDN-1 of the corresponding unit delay blocks 500<1>, 500<2>, . . . , 500<N-1> are coupled with the first signal input nodes IN_PUB_ND2, IN_PUB_ND3, . . . , IN_PUB_NDN of the rear unit delay blocks 500<2>, 500<3>, . . . , 500<N>, and the second signal input nodes IN_ND1_1, IN_ND1_2, . . . , IN_ND1_N-1 of the corresponding unit delay blocks 500<1>, 500<2>, . . . , 500<N-1> are coupled with the second signal output nodes OUT_ND1_2, OUT_ND1_3, . . . , OUT_ND1_N of the rear unit delay blocks 500<2>, 500<3>, . . . , 500<N>, while the third signal input nodes IN_ND2_1, IN_ND2_2, . . . , IN_ND2_N-1 of the corresponding unit delay blocks 500<1>, 500<2>, . . . , 500<N-1> are coupled with the third signal output nodes OUT_ND2_2, OUT_ND2_3, . . . , OUT_ND2_N of the rear unit delay blocks 500<2>, 500<3>, . . . , 500<N>.

When a corresponding unit delay block among the unit delay blocks 500<1>, 500<2>, . . . , 500<N> having the above-described structure is the beginning unit delay block 500<1> of the delay lines 500, the first delay control code CON_PUB<1> transferred to the unit delay block 500<1> is set at the logic level of the power source voltage VDD node.

Conversely, when a corresponding unit delay block among the unit delay blocks 500<1>, 500<2>, . . . , 500<N> having the above-described structure is not the beginning unit delay block 500<1> of the delay lines 500, the first delay control codes CON_PUB<2>, CON_PUB<3>, . . . , CON_PUB<N> transferred to the corresponding unit delay blocks 500<2>, 500<3>, . . . , 500<N> have the same logic level of the inverted signals /CON_1<1>, /CON_1<2>, . . . , /CON_1<N-1> of the second delay control codes transferred to the front first delay logic blocks 502<1>, 502<2>, . . . , 502<N-1>.

Herein, the first signal input nodes IN_PUB_NDN of the end unit delay block 500<N> among the plurality of the unit delay blocks 500<1>, 500<2>, . . . , 500<N> illustrated in FIG. 5 remains disconnected and thus it has no substantial function. Therefore, the signal IN_SIG_N may be used for another purpose according to different design needs, or if there is no usage purpose, the NAND gate NANDN_2 for generating the signal IN_SIG_N may be designed as if it does not exist at all.

According to the fourth embodiment of the present invention described above, the input signal IN_SIG_S transferred through the signal input node IN_SIG_ND of delay lines 500 is first delayed by a delay amount set in the input delay circuit 300, and then delayed again by predetermined delay amounts while passing through the first delay logic blocks 502<1>, 502<2>, . . . , 502<N> included in the plurality of the unit delay blocks 500<1>, 500<2>, . . . , 500<N>, and then delayed again by a predetermined delay amount while passing through the second delay logic blocks 504<1>, 504<2>, . . . , 504<N> and the third delay logic blocks 506<1>, 506<2>, . . . , 506<N> included in the unit delay blocks 500<1>, 500<2>, . . . , 500<N> to be thereby outputted as two output signals OUT_SIG1_F and OUT_SIG2_F through two output nodes OUT_SIG_ND1 and OUT_SIG_ND2.

Therefore, when the input signal IN_SIG_S is transferred to the signal input node IN_SIG_ND through an input driver 580, it is dependent on the loads of the first delay logic blocks 502<1>, 502<2>, . . . , 502<N> included in the plurality of the unit delay blocks 500<1>, 500<2>, 500<N>. Thus, it is possible not only to minimize/reduce the level change of the input signal IN_SIG_S but also to minimize/reduce the size of the input driver 580. As a result, the input signal IN_SIG_S can pass through the delay lines at a high accuracy and fast response rate.

Therefore, the delay lines according to the fourth embodiment of the present invention can be applied to a semiconductor device operating faster than conventional semiconductor devices.

Figure 6:
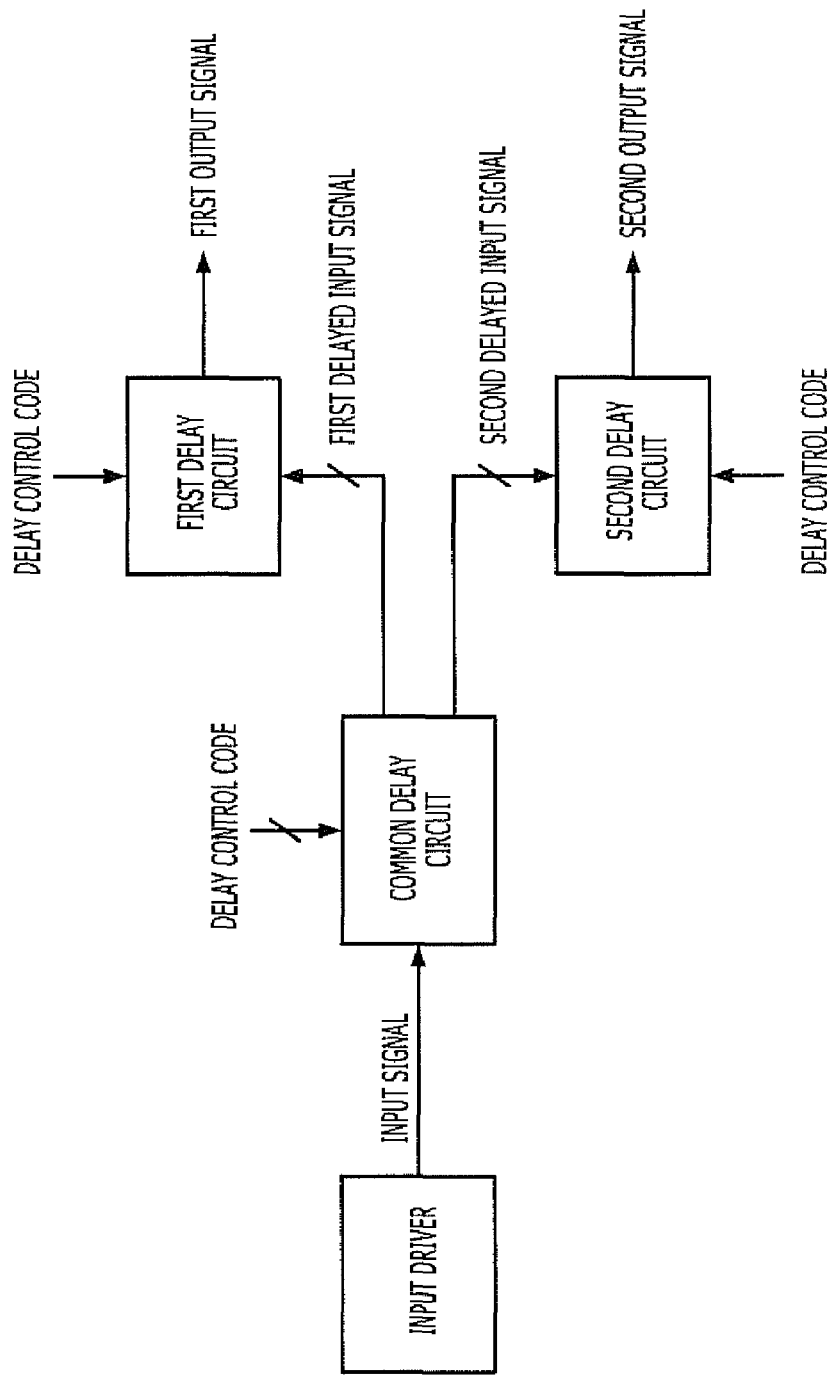
FIG. 6 is an overview block diagram illustrating a semiconductor device having delay lines in accordance with first through fourth embodiments of the present invention.

FIG. 6 is an overview block diagram illustrating a semiconductor device having delay lines in accordance with first through fourth embodiments of the present invention. FIG. 6 shows a semiconductor device including a common delay circuit configured to delay an input signal in response to a delay control code to output a first delayed input signal and a second delayed input signal, a first delay circuit configured to delay the first delayed input signal in response to the delay control code and to output a first output signal and a second delay circuit configured to delay the second delayed input signal in response to the delay control code and to output a second output signal.

According to the technology of the present invention described above, it is possible to minimize/reduce the size of an input driver for driving an input signal by coupling a signal input node with a common delay line and making a signal that has passed through the common delay line to two output nodes through an upper delay line and a lower delay line.

Since the common delay line has a structure with separated components on a delay unit basis, the level of the loading applied to the signal input node is small from the perspective of the input driver and the level of loads for the input signal can become small. Consequently, it is possible to make the input signal pass through the delay lines with a high accuracy and fast reaction speed.

Therefore, it may be said that the technology of the present invention may be applied to a semiconductor device having delay lines operating at a high speed.

While the present invention has been described with respect to the specific embodiments, it will be apparent to those skilled in the art that various changes and modifications may be made without departing from the spirit and scope of the invention as defined in the following claims.

For example, the logic gates and transistors exemplified in the above embodiments may be different in their positions and kinds according to the polarity of an input signal.

What is claimed is:

1. A semiconductor device, comprising:
   a common delay circuit configured to delay an input signal in response to a delay control code to output a first delayed input signal and a second delayed input signal;
   a first delay circuit configured to delay the first delayed input signal in response to the delay control code and to output a first output signal; and
   a second delay circuit configured to delay the second delayed input signal in response to the delay control code and to output a second output signal,
   wherein the delay control code includes a multi-bit common delay control code, a multi-bit first delay control code, and a multi-bit second delay control code,
   wherein the common delay circuit includes a plurality of common delay units that each operate in response to a corresponding bit of the common delay control code, the first delay circuit includes a plurality of first delay units that each operate in response to a corresponding bit of the first delay control code, and the second delay circuit includes a plurality of second delay units that each operate in response to a corresponding bit of the second delay control code, wherein the plurality of first delay units are each configured to select between delaying a respective one of a plurality of first delay input signals and delaying an output signal of a corresponding one of the plurality of common delay units, and wherein, when a bit among one of the first delay control code, the second delay control code, and the common delay control code is selectively enabled as the highest enabled bit of the code, lower bits of the code are all enabled while higher bits of the code are all disabled.

2. The semiconductor device of claim 1, further comprising:
a phase mixer configured to mix a phase of the first output signal with a phase of the second output signal.

3. The semiconductor device of claim 1, wherein the delay control code comprises:
the common delay control code for controlling an operation of the common delay circuit;
the first delay control code for controlling an operation of the first delay circuit; and
the second delay control code for controlling an operation of the second delay circuit.

4. The semiconductor device of claim 3, wherein a value of the common delay control code is equal to a value of the first delay control code and a value of the second delay control code, or the value of the common delay control code is equal to the value of the first delay control code and has a greater value than a value of the second delay control code.

5. The semiconductor device of claim 3, wherein the common delay circuit outputs the input signal without a delay when the common delay control code has an initial value, and delays the input signal when the common delay control code has a non-initial value for delaying by a multiple of a unit delay.

6. The semiconductor device of claim 5, wherein the first delay circuit delays the input signal by a unit delay when the first delay control code has an initial value, and wherein the first delay circuit delays the input signal transferred from the common delay circuit by a multiple of a unit delay when the first delay control code has a non-initial value.

7. The semiconductor device of claim 6, wherein the second delay circuit delays the input signal by two delay units when the second delay control code has an initial value, and wherein the second delay circuit delays the input signal transferred from the common delay circuit by a multiple of a unit delay when the second delay control code has a non-initial value.

8. The semiconductor device of claim 1, wherein each of the common delay units is configured to delay the input signal or the output signal of a preceding one of the common delay units by a delay unit depending on whether the corresponding bit of the common delay control code is enabled.

9. The semiconductor device of claim 1, wherein each of the first delay units is configured to delay the output signal of a preceding one of the first delay units by a delay unit when the corresponding bit of the first delay control code is enabled.

10. The semiconductor device of claim 1, wherein each of the first delay units is configured to delay the input signal or the corresponding first delay input signal depending on whether the corresponding bit of the first delay control code is disabled.

11. The semiconductor device of claim 1, wherein each of the second delay units is configured to delay the output signal of a preceding one of the second delay units by two delay units or one delay unit when the corresponding bit of the second delay control code is enabled.

12. The semiconductor device of claim 1, wherein each of the second delay units is configured to delay the input signal transferred through the plurality of common delay units by two delay units or one delay unit when the first delay control code is disabled.

13. The semiconductor device of claim 1, wherein each of the plurality of second delay units is configured to select between delaying a respective one of a plurality of second delay input signals and delaying the output signal of a corresponding one of the plurality of common delay units.

* * * * *